United States Patent
Lim et al.

(10) Patent No.: US 8,680,685 B2
(45) Date of Patent: Mar. 25, 2014

(54) SEMICONDUCTOR PACKAGE AND METHOD FOR FABRICATING THE SAME

(75) Inventors: Hwan-Sik Lim, Gunpo-si (KR);
Sunwon Kang, Seongnam-si (KR);
Jongho Lee, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 139 days.

(21) Appl. No.: 12/788,901

(22) Filed: May 27, 2010

(65) Prior Publication Data

US 2011/0095418 A1    Apr. 28, 2011

(30) Foreign Application Priority Data

Oct. 26, 2009    (KR) .................. 10-2009-0101683

(51) Int. Cl.
*H01L 23/48* (2006.01)

(52) U.S. Cl.
USPC .......................................... 257/775; 257/737

(58) Field of Classification Search
USPC ................................................. 257/737, 775
See application file for complete search history.

(56) References Cited

U.S. PATENT DOCUMENTS

| 6,175,157 | B1 * | 1/2001 | Morifuji ................. 257/777 |
| 6,911,733 | B2 | 6/2005 | Kikuchi et al. |
| 7,214,622 | B2 | 5/2007 | Sugiyama et al. |
| 7,368,817 | B2 | 5/2008 | Pendse |
| 7,964,948 | B2 * | 6/2011 | Lee et al. ................. 257/686 |
| 2005/0023147 | A1 * | 2/2005 | Hashimoto ............... 205/122 |
| 2009/0008801 | A1 * | 1/2009 | Lai et al. ................. 257/782 |
| 2009/0230549 | A1 | 9/2009 | Lee et al. |
| 2011/0074025 | A1 * | 3/2011 | Yanase et al. ............ 257/737 |

FOREIGN PATENT DOCUMENTS

| JP | 2001-358172 | 12/2001 |
| JP | 2006-049477 | 2/2006 |
| JP | 2008-034890 | 2/2008 |
| KR | 1020090098316 | 9/2009 |

* cited by examiner

*Primary Examiner* — Douglas Menz
(74) *Attorney, Agent, or Firm* — F. Chau & Associates, LLC

(57) ABSTRACT

A semiconductor package includes a semiconductor chip having a first bump group and a second bump group, and a package substrate having a first pattern for data communication with the semiconductor chip and a second pattern for supplying power to the semiconductor chip or grounding the semiconductor chip, wherein the first bump group is disposed on the first pattern and the second bump group is disposed on the second pattern.

33 Claims, 44 Drawing Sheets

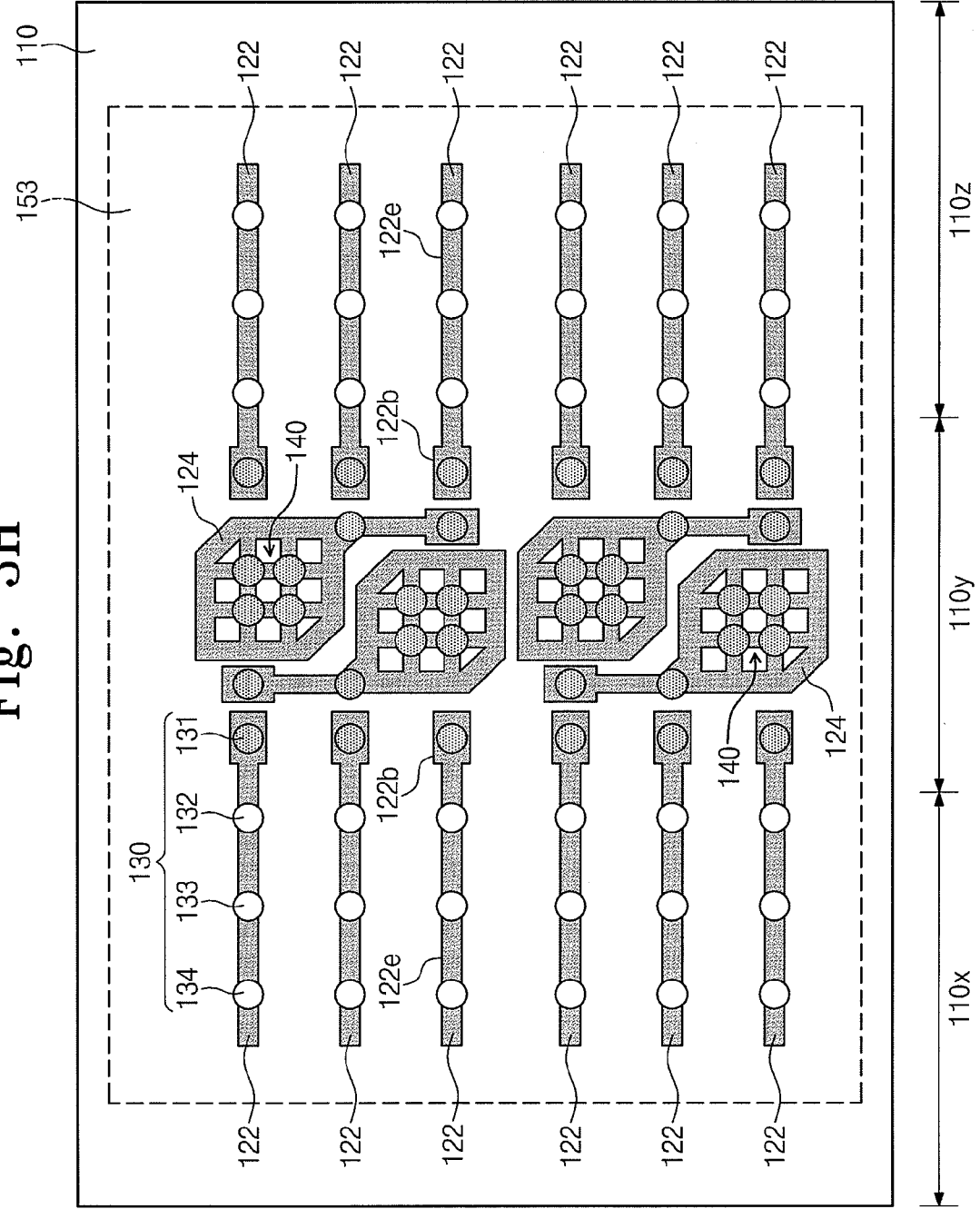

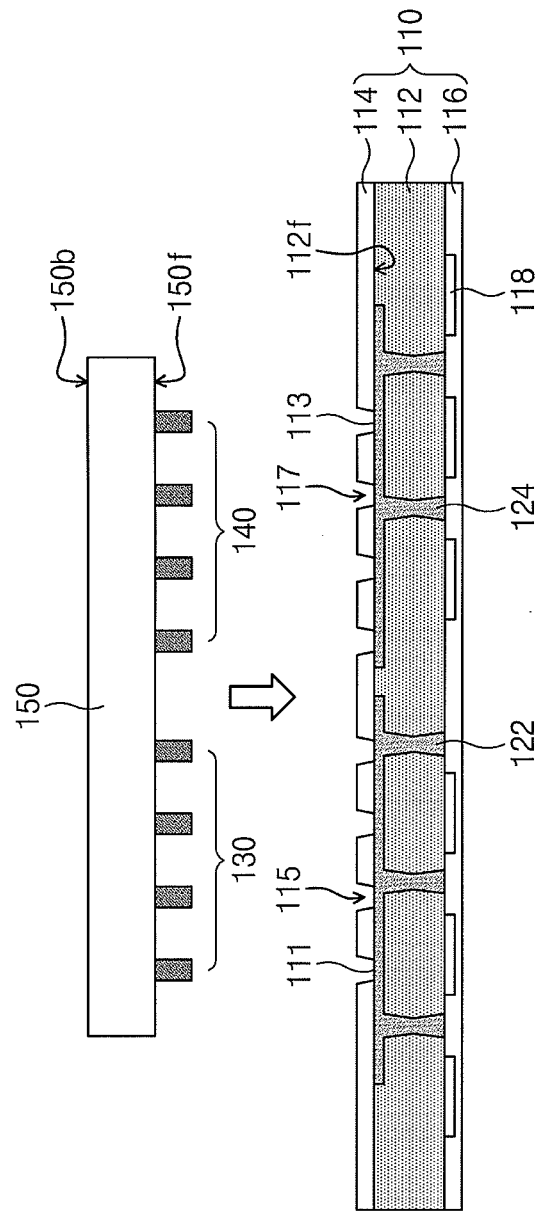

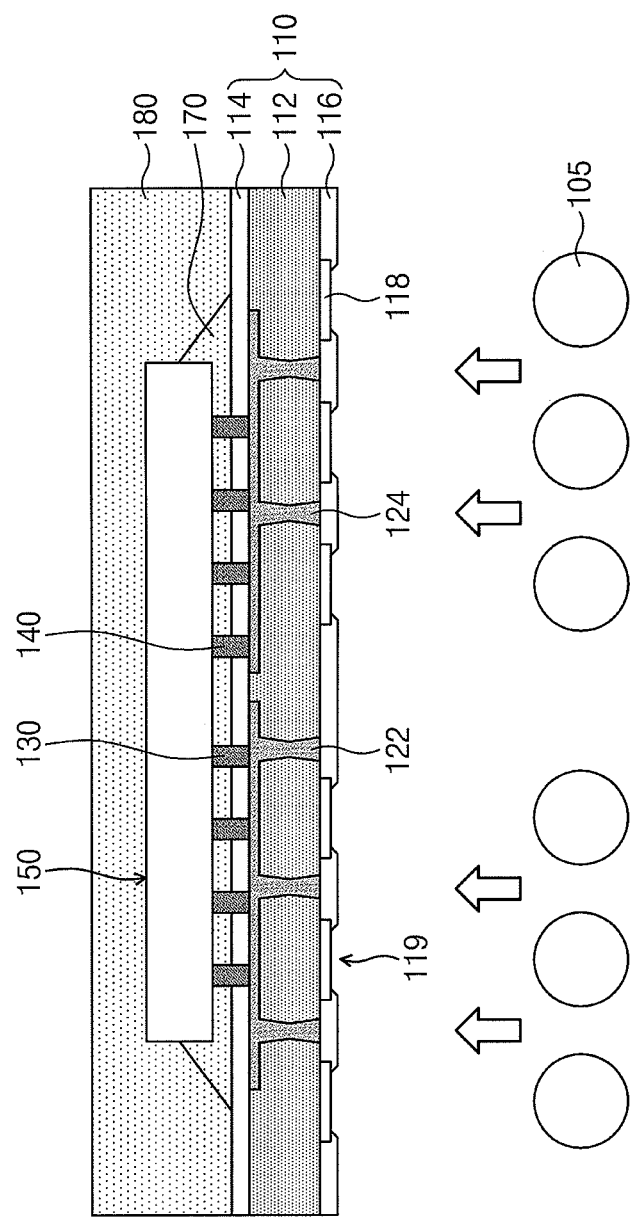

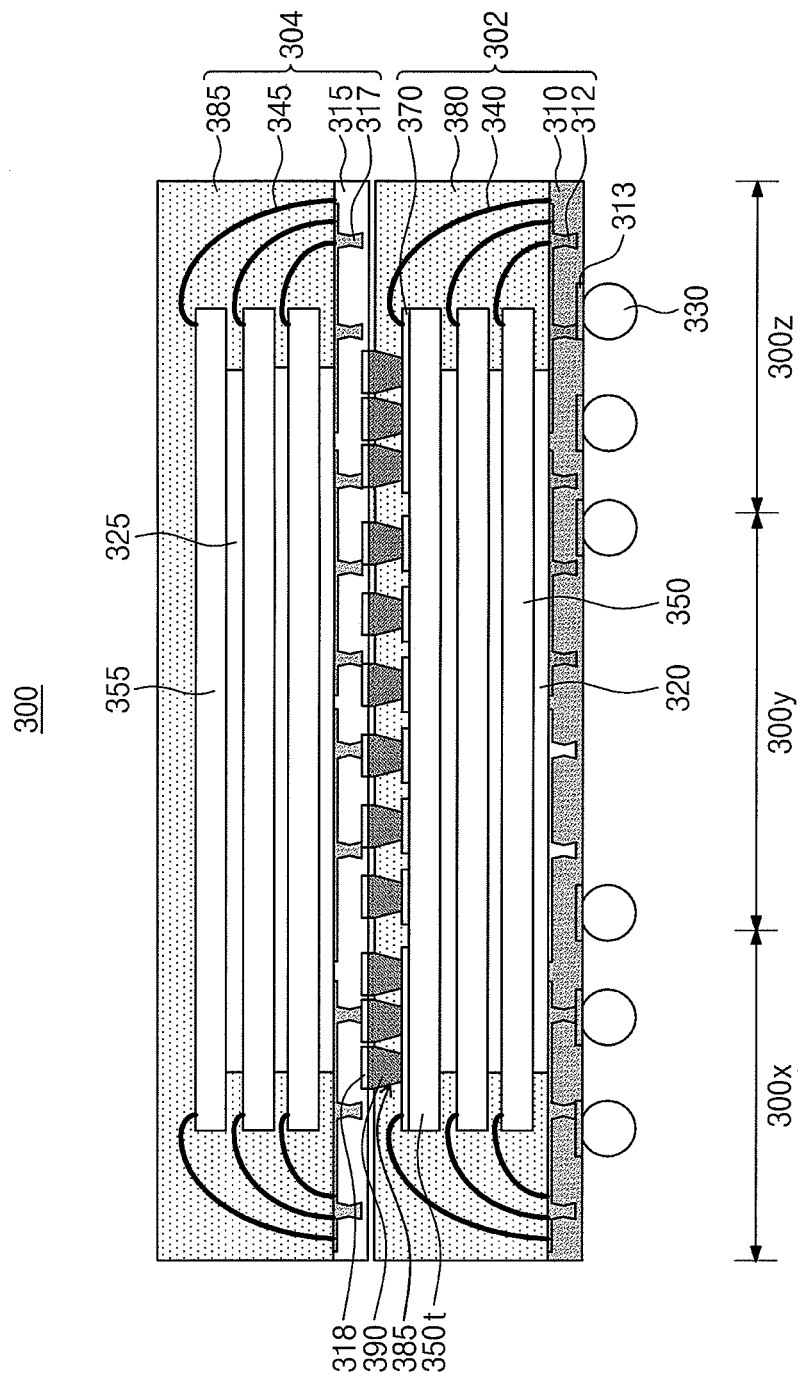

SEMICONDUCTOR PACKAGE AND METHOD FOR FABRICATING THE SAME

CROSS-REFERENCE TO RELATED APPLICATION

This application claims priority under 35 U.S.C. §119 to Korean Patent Application No. 10-2009-0101683, filed on Oct. 26, 2009, the entire contents of which are hereby incorporated by reference.

BACKGROUND

1. Technical Field

The present disclosure relates to semiconductor devices, and more particularly, to semiconductor packages and methods for fabricating the same.

2. Discussion of Related Art

A number of semiconductor chips having similar or different functions can be stacked on top of each other to form a semiconductor package. An example of this configuration is a flip-chip package. The flip-chip package includes a semiconductor chip disposed on a package substrate. A plurality of bumps are disposed on the semiconductor chip and printed circuit board (PCB) patterns are disposed on the package substrate. However, separate lands on the package substrate are required for receiving the bumps, and the PCB patterns are formed around the lands. Forming separate lands and/or forming the PCB patterns around the lands increases manufacturing costs.

SUMMARY

Embodiments of the inventive concept provide semiconductor packages and methods for fabricating the same, which improves the mechanical and electrical characteristics of the semiconductor packages.

Embodiments of the inventive concept also provide semiconductor packages and methods for fabricating the same, which can eliminate or minimize the area consumption and the bypass formation of a PCB caused by formation of a separate land, by using PCB patterns as a land for bumps.

Embodiments of the inventive concept also provide semiconductor packages and methods for fabricating the same, which can improve the mechanical and electrical characteristics by bonding a plurality of bumps to one PCB pattern.

Embodiments of the inventive concept also provide semiconductor packages and methods for fabricating the same, which can apply the utilization of PCB patterns as a land and the bonding of a plurality of bumps to one PCB to chip stacking and package stacking.

According to an exemplary embodiment, a semiconductor package comprises a semiconductor chip having a first bump group and a second bump group, and a package substrate having a first pattern for data communication with the semiconductor chip and a second pattern for supplying power to the semiconductor chip or grounding the semiconductor chip, wherein the first bump group is disposed on the first pattern and the second bump group is disposed on the second pattern.

The first bump group may comprise a first real bump disposed on a first conductive pad of the semiconductor chip and a first dummy bump disposed on a passivation layer of the semiconductor chip, and the second bump group may comprise a second real bump disposed on a second conductive pad and a second dummy bump disposed on the passivation layer.

The first real bump and the second real bump can be disposed between the first dummy bump and the second dummy bump.

The first dummy bump and the second dummy bump can be disposed between the first real bump and the second real bump.

The first bump group may comprise a first real bump disposed on a first conductive pad of the semiconductor chip and a first dummy bump disposed on a passivation layer of the semiconductor chip, and the second bump group may comprise a second real bump disposed on a second conductive pad and a third real bump disposed on a third conductive pad.

The second conductive pad and the third conductive pad can be electrically connected to each other.

The second conductive pad and the third conductive pad can be electrically isolated from each other.

The second bump group may further comprise a fourth real bump disposed on both a fourth conductive pad and a fifth conductive pad.

The first bump group may comprise a first real bump disposed on a first conductive pad of the semiconductor chip and a second real bump disposed on a second conductive pad, and the second bump group may comprise a third real bump disposed on a third conductive pad and a fourth real bump disposed on a fourth conductive pad.

The second bump group may further comprise a fifth real bump disposed on both a sixth conductive pad and a seventh conductive pad.

The third real bump and the fourth real bump can be disposed on a common power metal formed on a substrate of the semiconductor chip.

The third real bump and the fourth real bump can be disposed on a redistribution line disposed on a substrate of the semiconductor chip.

The first real bump and the second real bump can be electrically connected to each other, and the third real bump and the fourth real bump can be electrically connected to each other.

The first real bump and the second real bump can be electrically connected to each other, and the third real bump and the fourth real bump can be electrically isolated from each other.

A width of the second conductive pad can be larger than a width of the third conductive pad.

The first real bump can provide an electrical signal path between the semiconductor chip and the first pattern, and the first dummy bump supports the semiconductor chip on the package substrate.

The second real bump can provide a power signal path between the semiconductor chip and the second pattern, and the second dummy bump can support the semiconductor chip on the package substrate.

The first dummy bump can be larger than the first real bump and the second dummy bump can be larger than the second real bump.

The first pattern may comprise a land receiving the first real bump and an extension extending from the land to receive the first dummy bump, the extension having a smaller width than the land.

The second pattern may comprise a land receiving the second real bump and an extension extending from the land to receive the second dummy bump, the extension being larger than the land.

The first and second patterns may comprise PCB patterns.

The first and second real bumps may comprise metal.

According to an exemplary embodiment, a semiconductor package may comprise a package substrate having at least one circuit pattern, and a semiconductor chip having a plurality of bumps, the semiconductor chip disposed on the package substrate, wherein at least two bumps of the semiconductor chip are disposed on the at least one circuit pattern.

The at least two bumps may comprise a first bump disposed on a pad and connected to an on chip circuit, and a second bump disposed on a passivation layer of the semiconductor chip.

The at least two bumps may comprise a first bump disposed on a pad and connected to an on chip circuit, and a second bump disposed on an on chip metal and electrically connected to the first bump.

The second bump can be larger than the first bump.

According to an exemplary embodiment, a semiconductor package comprises a package substrate having a plurality of circuit patterns, and a semiconductor chip having a plurality of bumps, the semiconductor chip disposed on the package substrate, wherein respective extension paths of the plurality of bumps correspond to respective extension paths of the circuit patterns.

The plurality of bumps can be distributed uniformly.

The plurality of bumps can be distributed non-uniformly.

A majority of the bumps can be distributed near an edge of the semiconductor chip.

According to an exemplary embodiment, a method of forming a semiconductor package comprises forming a plurality of circuit patterns on a package substrate, forming a plurality of bumps on a semiconductor chip following extension paths of the plurality of circuit patterns of the package substrate, and disposing the package substrate on the semiconductor chip such that the plurality of bumps are disposed on the plurality of circuit patterns.

The plurality of bumps can be disposed uniformly from one end to the other end of each circuit pattern.

The plurality of bumps may comprise a plurality of dummy bumps electrically insulated from the circuit patterns.

According to an exemplary embodiment, a system for transmitting or receiving data comprises a memory device for storing a program, and a processor in communication with the memory device, wherein the memory device comprises a semiconductor package comprising, a package substrate having a plurality of circuit patterns, and a semiconductor chip having a plurality of bumps, the semiconductor chip disposed on the package substrate, wherein respective extension paths of the plurality of bumps correspond to respective extension paths of the circuit patterns. The system may comprise at least one of a mobile system, a portable computer, a web tablet, a mobile phone, a digital music player, or a memory card.

BRIEF DESCRIPTION OF THE DRAWINGS

Exemplary embodiments of the inventive concept can be understood in more detail from the following descriptions taken in conjunction with the accompanying drawings, in which:

FIGS. 3H and 3I are plan views illustrating some embodiments of the PCB patterns of FIG. 3C.

FIGS. 5A to 5D are sectional views illustrating a semiconductor package fabrication method according to an embodiment of the inventive concept;

FIG. 8A is a sectional view of a semiconductor package according to an embodiment of the inventive concept;

DETAILED DESCRIPTION OF EXEMPLARY EMBODIMENTS

Exemplary embodiments of the inventive concept will be described below in more detail with reference to the accompanying drawings. The inventive concept may, however, be embodied in different forms and should not be construed as limited to the embodiments set forth herein.

Figure 1A:
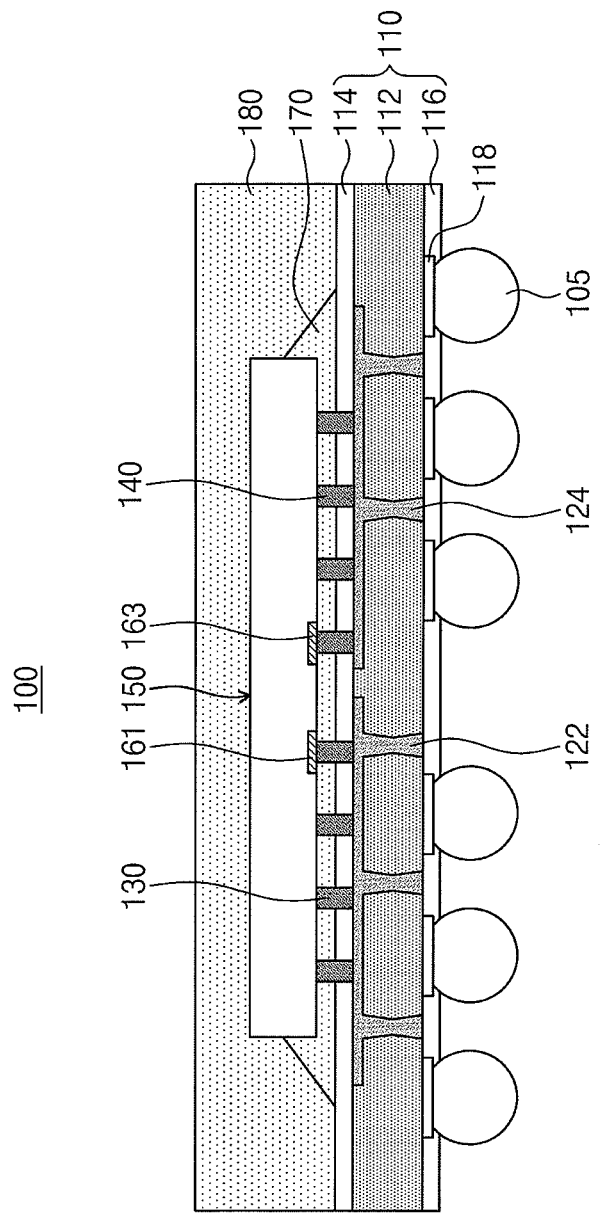
FIG. 1A is a sectional view of a semiconductor package according to an embodiment of the inventive concept.
Figure 1B:
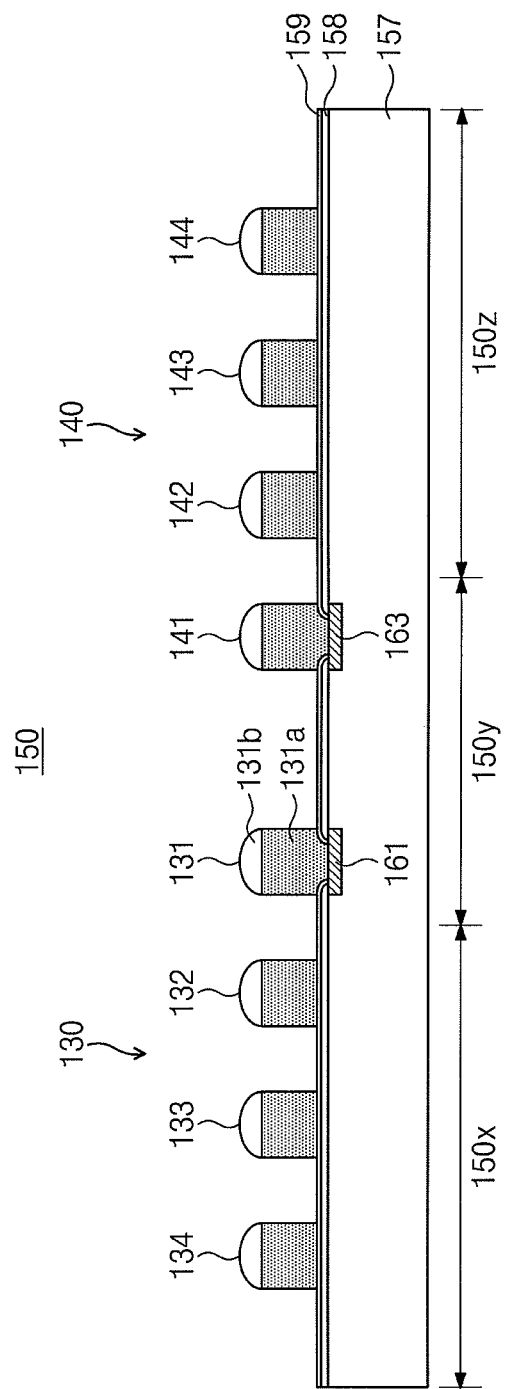
FIGS. 1B and 1C are sectional views of a semiconductor chip in a semiconductor package according to an embodiment of the inventive concept.
Figure 1C:
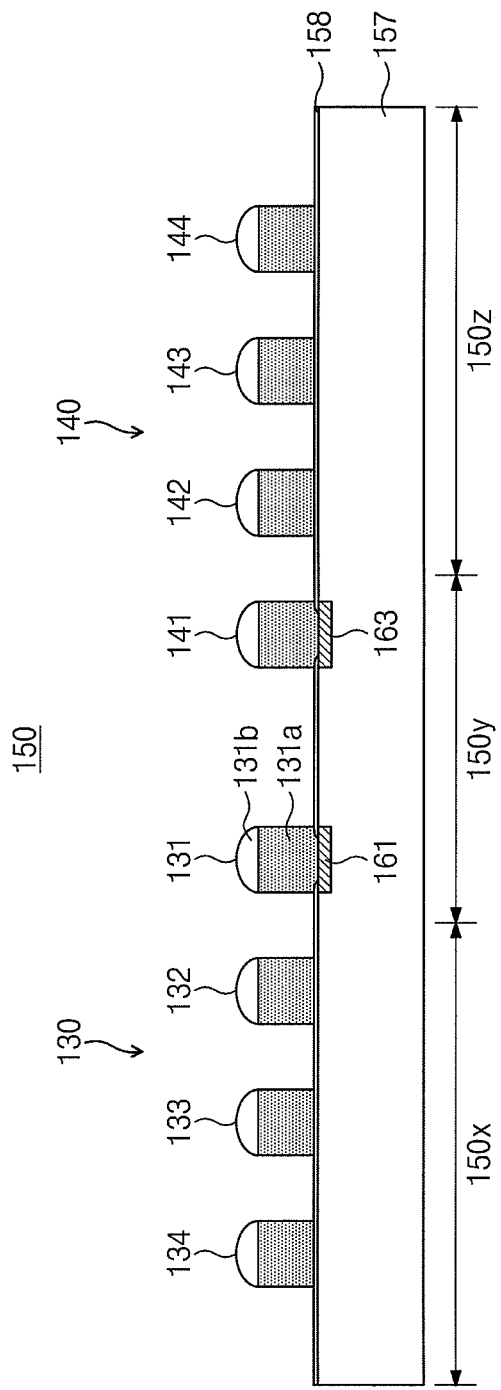
Figure 1D:
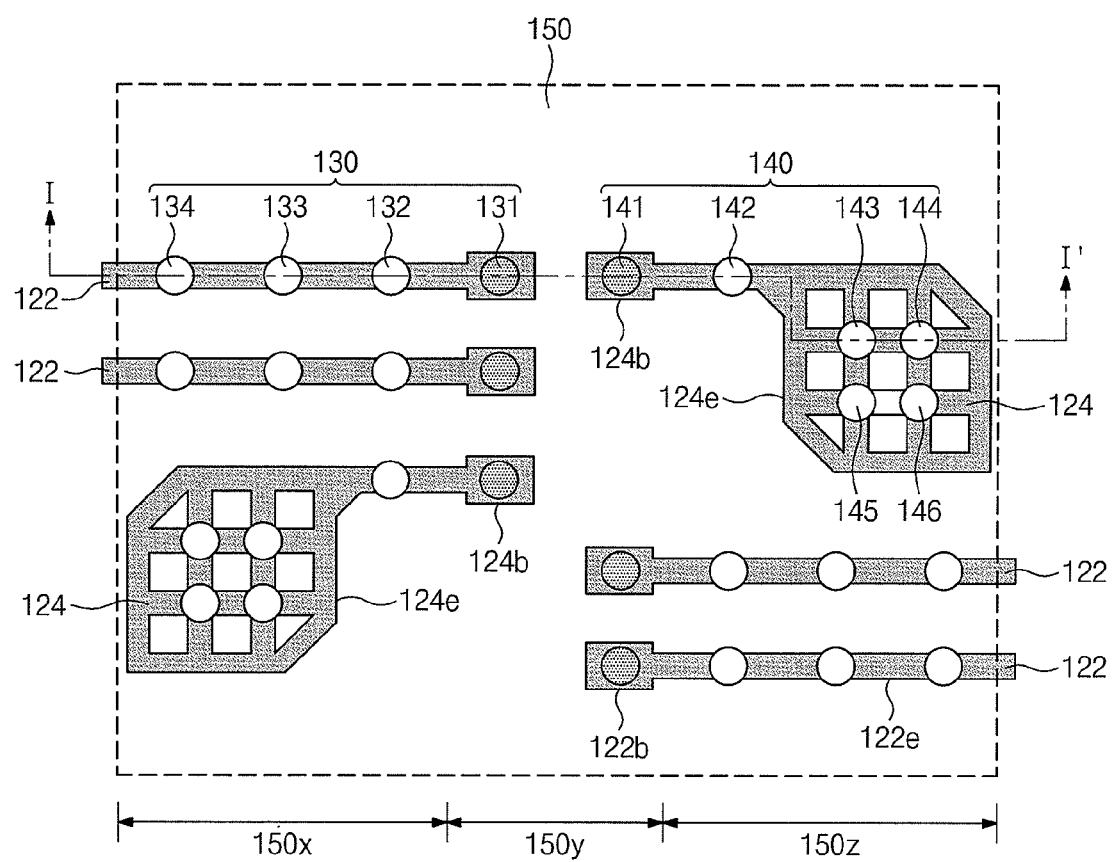
FIG. 1D is a plan view illustrating PCB patterns in a semiconductor package according to an embodiment of the inventive concept.
Figure 1E:
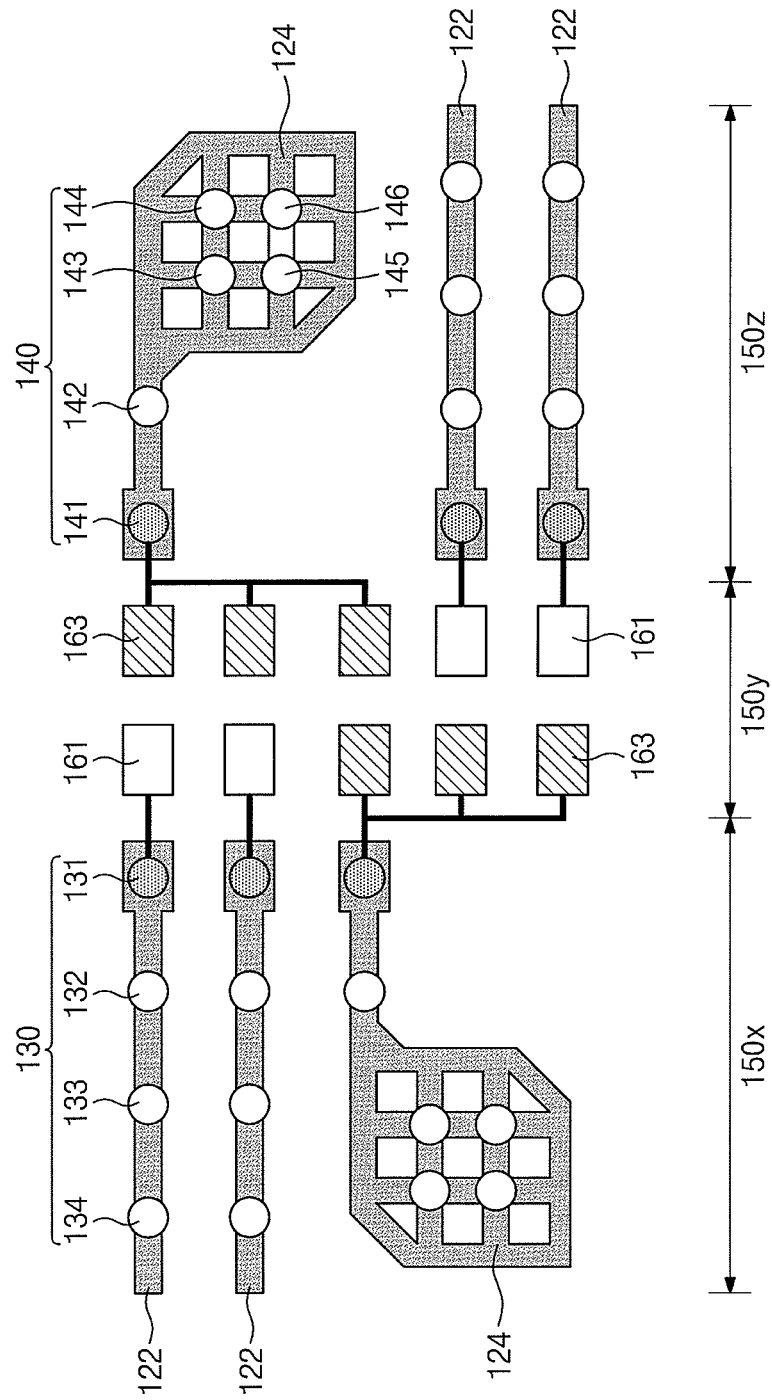
FIG. 1E is a plan view illustrating electrical connections between chip pads and bumps in a semiconductor package according to an embodiment of the inventive concept.
Figure 1F:
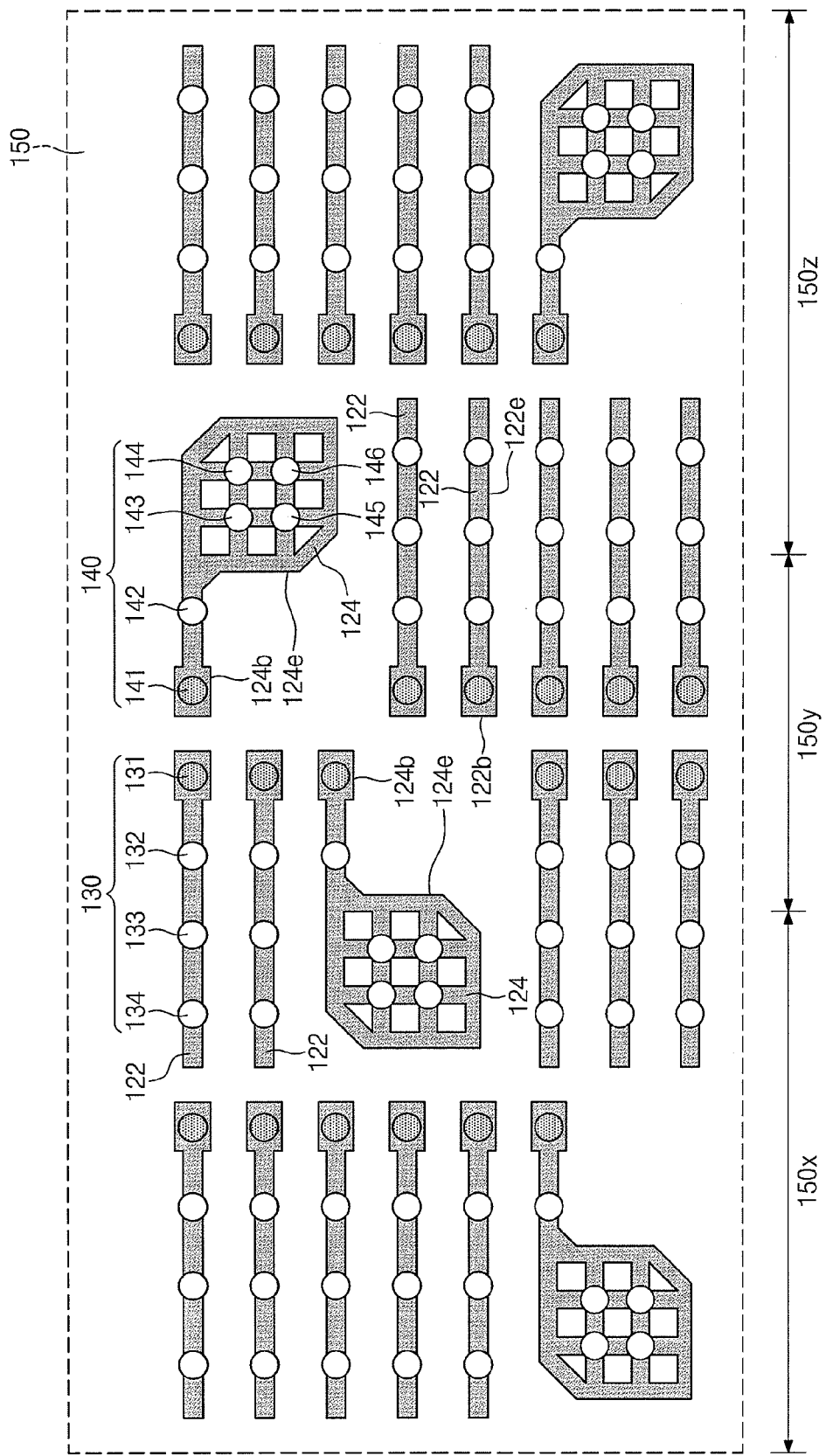
FIG. 1F is a plan view illustrating electrical connections between chip pads and bumps in a semiconductor package according to an embodiment of the inventive concept.

FIG. 1A is a sectional view of a semiconductor package according to an embodiment of the inventive concept, which is taken along the line I-I' of FIG. 1D. FIGS. 1B and 1C are sectional views of a semiconductor chip in the semiconductor package of FIG. 1A. FIG. 1D is a plan view illustrating a PCB patterns in the semiconductor package of FIG. 1A. FIG. 1E is a plan view illustrating electrical connections between chip pads and bumps in the semiconductor package of FIG. 1A. FIG. 1F is a plan view illustrating PCB patterns in the semiconductor package according to an embodiment of the inventive concept.

Referring to FIG. 1A, a semiconductor package 100 according to an embodiment of the inventive concept may include a package substrate 110 and a semiconductor chip 150 mounted on the package substrate 110. The semiconductor package 100 may be molded by a molding layer 180. An underfill layer 170 may be provided between the semiconductor chip 150 and the package substrate 110. The semiconductor package 100 may be a flip-chip package where the semiconductor chip 150 is facedown-mounted on the package substrate 110.

For example, the package substrate 110 may include a printed circuit board (PCB) that has copper-clad circuit patterns formed on one or both sides of a core 112 formed of fiber-reinforced glass or epoxy resin. The circuit patterns may include a pattern for providing an electrical signal path for data communication with the semiconductor chip 150, a pattern for delivering power to the semiconductor chip 150 or grounding the semiconductor chip 150, and a pattern connected to an external terminal. According to an exemplary embodiment, the package substrate 110 may include at least one first pattern 122 for providing an electrical signal path for data communication with the semiconductor chip 150, and at least one second pattern 124 for supplying power to the semiconductor chip 150 or grounding the semiconductor chip 150. For example, at least one of the first and second patterns 122 and 124 may be formed in the shape of line and/or plate having at least one vertical via, wherein the via is substantially perpendicular to a surface of the first or second pattern 122, 124. The first pattern 122 may include at least one of a signal pattern, a power pattern and a ground pattern. Similarly, the second pattern 124 may include at least one of a signal pattern, a power pattern and a ground pattern. The first and second patterns 122 and 124 may be different from each other. As one example, the first pattern 122 may be the signal pattern, and the second pattern 124 may be one of the power and ground patterns.

The package substrate 110 may include a substrate pad 118 connected to an external terminal 105 (e.g., a solder ball or lead-frame) that electrically connects the semiconductor package 100 to an external electrical device. Alternatively, the substrate pad 118 may be used as the external terminal. The substrate pad 118 may comprise, for example, copper or aluminum. For example, an upper dielectric layer 114 and a lower dielectric layer 116, formed of photoresist, may be disposed respectively on the top and bottom surfaces of the core 112. The signal pattern 122 and the power pattern 124 may be exposed through the upper dielectric layer 114, and the substrate pad 118 may be exposed through the lower dielectric layer 116.

Referring to FIGS. 1A and 1B, the semiconductor chip 150 may be a memory or non-memory chip that has bumps 130 and 140 formed on a semiconductor substrate 157. The semiconductor substrate 157 may be, for example, a silicon wafer or a silicon-on-insulator (SOI) wafer. The semiconductor chip 150 may have a center pad structure. For example, the semiconductor chip 150 may include center chip pads 161 and 163 disposed at a center 150y thereof, a passivation layer 158 protecting the semiconductor substrate 157, and a dielectric layer 159 defining a land for the bumps 130 and 140. The center chip pads 161 and 163 may be formed of metal such as, for example, copper or aluminum. The passivation layer 158 may be formed of resin such as, for example, photosensitive polyimide (PSPI). The dielectric layer 159 may be formed of dielectric such as, for example, silicon oxide or silicon nitride. The semiconductor chip 150 may be flip-mounted on the package substrate 110, and the bumps 130 and 140 may be connected to the PCB patterns 122 and 124 of the package substrate 110. The bumps 130 and 140 may include a first bump group 130 connected electrically to the signal pattern 122, and a second bump group 140 connected electrically to the power pattern 124.

The first bump group 130 may include at least one bump 131 connected to the center chip pad 161, and a plurality of bumps 132, 133 and 134 that are not connected to the center chip pad 161. The bump 131 may be a real bump for providing an electrical signal path between the semiconductor chip 150 and the signal pattern 122, and the bumps 132 to 134 may be dummy bumps for supporting the semiconductor chip 150 on the package substrate 110. The real bump 131 may be disposed at the center 150y of the semiconductor chip 150, and the dummy bumps 132 to 134 may be disposed at an edge region of the semiconductor chip 150. For example, the dummy bumps 132 to 134 may be disposed at one side edge (e.g., a left edge 150x) of the semiconductor chip 150.

The second bump group 140 may include at least one bump 141 connected to the center chip pad 163, and a plurality of bumps 142, 143 and 144 that are not connected to the center chip pad 163. The bump 141 may be a real bump for providing a power signal between the semiconductor chip 150 and the power pattern 124, and the bumps 142 to 144 may be dummy bumps for supporting the semiconductor chip 150 on the package substrate 110. The real bump 141 may be disposed at the center 150y of the semiconductor chip 150, and the dummy bumps 142 to 144 may be disposed at an edge region of the semiconductor chip 150. For example, the dummy bumps 142 to 144 may be disposed at one side edge (e.g., a right edge 150z) of the semiconductor chip 150. In an exemplary embodiment, the second bump group 140 may further include dummy bumps 145 and 146 as illustrated in FIG. 1D. The bump 131 may include a pillar 131a formed of metal such as, for example, copper. Solder 131*b* may be disposed on the pillar 131*a*. The solder 131*b* may increase the bonding force between the pillar 131*a* and the first pattern 122.

Referring to FIG. 1C, the semiconductor chip 150 does not include the dielectric layer 159 (see FIG. 1B), and the passivation layer 158 protects the semiconductor substrate 157 and defines the bump land. In an exemplary embodiment, in the first bump group 130, the real bump 131 may be different in size from the dummy bumps 132 to 134. For example, to support the semiconductor chip 150, the dummy bumps 132 to 134 may be larger than the real bump 131. In an exemplary embodiment, in the second bump group 140, the dummy bumps 142 to 146 may be larger than the real bump 141.

Referring to FIGS. 1A and 1D, the package substrate 110 may include PCB patterns in which at least one signal pattern 122 and at least one power pattern 124 may be provided. The first bump group 130 may be connected to the signal pattern 122, and the second bump group 140 may be connected to the power pattern 124. According to an embodiment of the inventive concept, all the bumps 131 to 134 of the first bump group 130 may be disposed on the signal pattern 122, and all the bumps 141 to 146 of the second bump group 140 may be disposed on the power pattern 124. In the drawings including FIG. 1D, a hatched circle represents a real bump, and a hollow circle represents a dummy bump.

The signal pattern 122 may include a land 122*b* connected to the real bump 131, and an extension portion 122*e* extending from the land 122*b*. The extension portion 122*e* may be smaller in width than the land 122*b*. For example, the land 122*b* may be disposed at the center 150*y* of the semiconductor chip 150, and the extension portion 122*e* may extend from the center 150*y* to the left edge 150*x* or the right edge 150*z*. Similarly, the power pattern 124 may include a land 124*b* connected to the real bump 141, and an extension portion 124*e* extending from the land 124*b*. For effective power delivery, the extension portion 124*e* may be much larger than the land 124*b*. For example, the land 124*b* may be disposed at the center 150*y* of the semiconductor chip 150, and the extension portion 124*e* may extend from the center 150*y* to the right edge 150*z* or the left edge 150*x*. The signal pattern 122 is not limited to a straight line shape and may have various shapes such as, for example, a bending shape. Similarly, the power pattern 124 is not limited to a line shape and may have various shapes.

In the signal pattern 122 on the line I-I', the real bump 131 of the first bump group 130, which is disposed at the center 150*y* of the semiconductor chip 150, may be connected to the land 122*b* of the signal pattern 122 to transmit electrical signals from the semiconductor chip 150 to the signal pattern 122 or from the signal pattern 122 to the semiconductor chip 150. The dummy bumps 132 to 134 of the first bump group 130, which are located at the left edge 150*x* of the semiconductor chip 150, may be connected to the extension portion 122*e* of the signal pattern 122 to support the semiconductor chip 150 on the package substrate 110. Because the extension portion 122*e* of the signal pattern 122 is used as a land for the dummy bumps 132 to 134, it is unnecessary to form dummy bump lands in the package substrate 110. Thus, the area of the package substrate 110 can be maximized. According to an embodiment, the signal pattern 122 can be formed without changing extension directions around the dummy bumps, and an input/output (I/O) skew caused by the changing of the extension directions can be prevented. The number or density of the dummy bumps 132 to 134 is not limited to this embodiment. The dummy bumps 132 to 134 may be distributed at the left edge 150*x* or the right edge 150*z* with a uniform density or a non-uniform density. The dummy bumps 132 to 134 may be intensively arranged at a portion of the semiconductor chip 150 to which a relatively heavy stress is applied. For example, a larger number of dummy bumps 132 to 134 may be arranged at the outermost portion of the left edge 150*x* or the right edge 150*z* than at the other portions.

Similarly, in the power pattern 124 on the line I-I', the real bump 141 of the second bump group 140, which is disposed at the center 150*y* of the semiconductor chip 150, may be connected to the land 124*b* of the power pattern 124 to transmit electrical signals from the power pattern 124 to the semiconductor chip 150. The dummy bumps 142 to 146 of the second bump group 140, which are located at the right edge 150*z* of the semiconductor chip 150, may be connected to the extension portion 124*e* of the power pattern 124 to support the semiconductor chip 150 on the package substrate 110. Because the extension portion 124*e* of the power pattern 124 is used as a land for the dummy bumps 142 to 146, there is no consumption of the area of the package substrate 110 by the dummy bump land and it is unnecessary to form the power pattern 124 in a bypass manner or in a reduced manner. Accordingly, power can be smoothly and stably supplied to the semiconductor chip 150. The number or density of the dummy bumps 142 to 146 is not limited to this embodiment. The dummy bumps 142 to 146 may be distributed at the left edge 150*x* or the right edge 150*z* with a uniform density or a non-uniform density. The dummy bumps 142 to 146 may be intensively arranged at a portion of the chip 150 to which a relatively heavy stress is applied. For example, a larger number of dummy bumps 142 to 146 may be arranged at the outermost portion of the left edge 150*x* or the right edge 150*z* than at the other portions.

Referring to FIG. 1E, the first bump group 130 may be in one-to-one correspondence with the center chip pad 161, and the second bump group 140 may be in one-to-one or one-to-many correspondence with the center chip pad 163. For example, one first bump group 130 connected to one signal pattern 122 may be electrically connected to one center chip pad 161. One second bump group 140 connected to one power pattern 124 may be electrically connected to one or more center chip pads 163. The center chip pad 161 and the real bump 131 can be vertically aligned. However, in FIG. 1E, for the convenience of illustration, the center chip pad 161 and the real bump 131 are illustrated as being horizontally aligned. Also, in FIG. 1E, for the convenience of illustration, the center chip pad 163 and the real bump 141 are illustrated as being horizontally aligned.

When external stress or heat is applied to the semiconductor package 100, mechanical and/or thermal stress may be more concentrated to the edges 150*x* and 150*z* than to the center 150*y* of the semiconductor chip 150, which may cause exfoliations or cracks in the semiconductor package 100. According to an embodiment of the inventive concept, the mechanical durability of the semiconductor package 100 can be improved because the edges 150*x* and 150*z* of the semiconductor chip 150 are supported by the dummy bumps 132 to 134 and 142 to 146.

According to an embodiment of the inventive concept, the semiconductor chip 150 can have a center pad structure. Accordingly, power can be symmetrically delivered from the center 150*y* to the left and right edges 150*x* and 150*z*. Therefore, stable power supply can be implemented, I/O skew can be eliminated, and cell distribution can be managed efficiently. Also, according to an embodiment of the inventive concept, the semiconductor package 100 can have a flip-chip bonding structure. Therefore, the semiconductor package 100 can implement more inputs/outputs than a wire-bonding structure and a lead-bonding structure, and can reduce the length of an electrical signal path. Due to the above characteristics, the semiconductor package 100 according to an embodiment of the inventive concept can be usefully utilized in graphic devices and electronic data processing (EDP) devices.

Referring to FIG. 1F, the semiconductor chip 150 may have a matrix pad structure. In this embodiment, the signal pattern 122 and the power pattern 124 may be arranged uniformly or non-uniformly at the package substrate 110. In this case, because the first bump group 130 may be arranged uniformly or non-uniformly at the overall area of the semiconductor chip 150, real bumps 131 may be distributed not only at the center 150y of the semiconductor chip 150 but also at the left edge 150x and/or the right edge 150z thereof. Similarly, the dummy bumps 132 to 134 may be distributed not only at the center 150y of the semiconductor chip 150 but also at the left edge 150x and/or the right edge 150z thereof. The arrangement of the second bump group 140 may be identical to that of the first bump group 130.

Figure 2A:
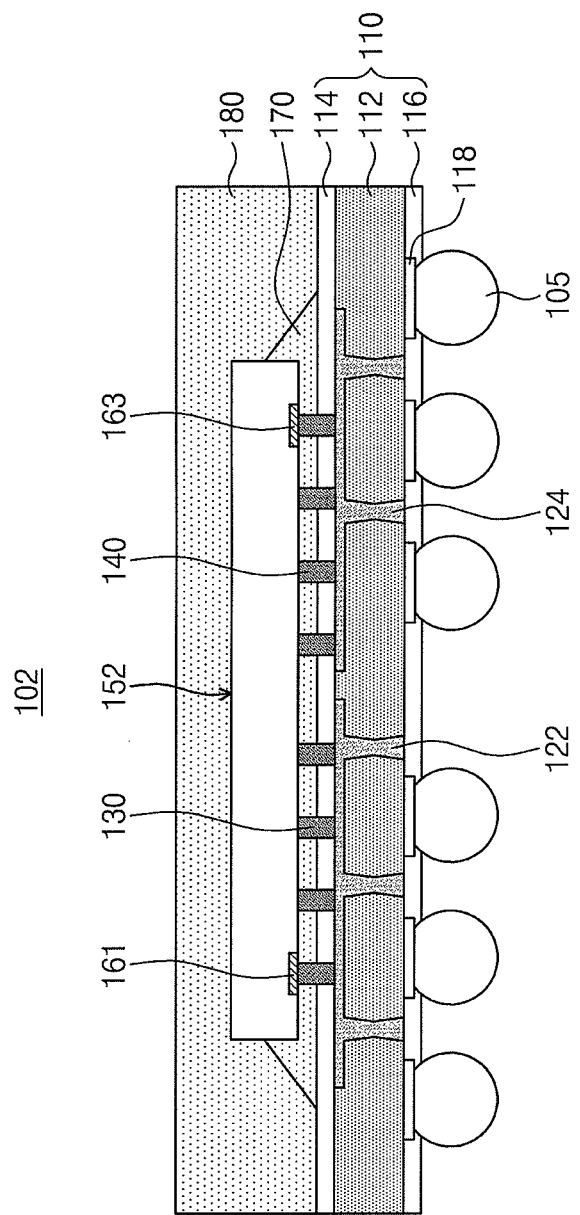
FIG. 2A is a sectional view of a semiconductor package according to an embodiment of the inventive concept.

FIGS. 2A to 2D illustrate an embodiment according to the inventive concept. FIG. 2A is a sectional view taken along the line II-II' of FIG. 2C.

Figure 2B:
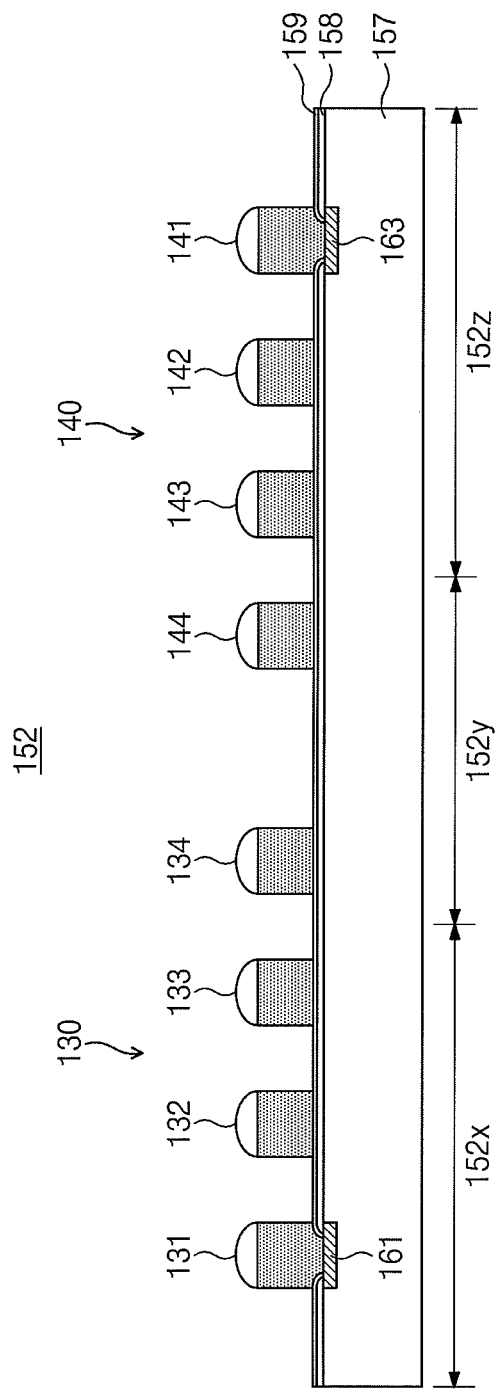
FIG. 2B is a sectional view of a semiconductor chip in a semiconductor package according to an embodiment of the inventive concept.

Referring to FIGS. 2A and 2B, a semiconductor package 102 according to an embodiment may be a flip-chip package where a semiconductor chip 152 with an edge pad structure is facedown-mounted on a package substrate 110. For example, chip pads 161 and 163 may be disposed at edges 152x and 152z of the semiconductor chip 152, and real bumps 131 and 141 may be connected to the edge chip pads 161 and 163.

Figure 2C:
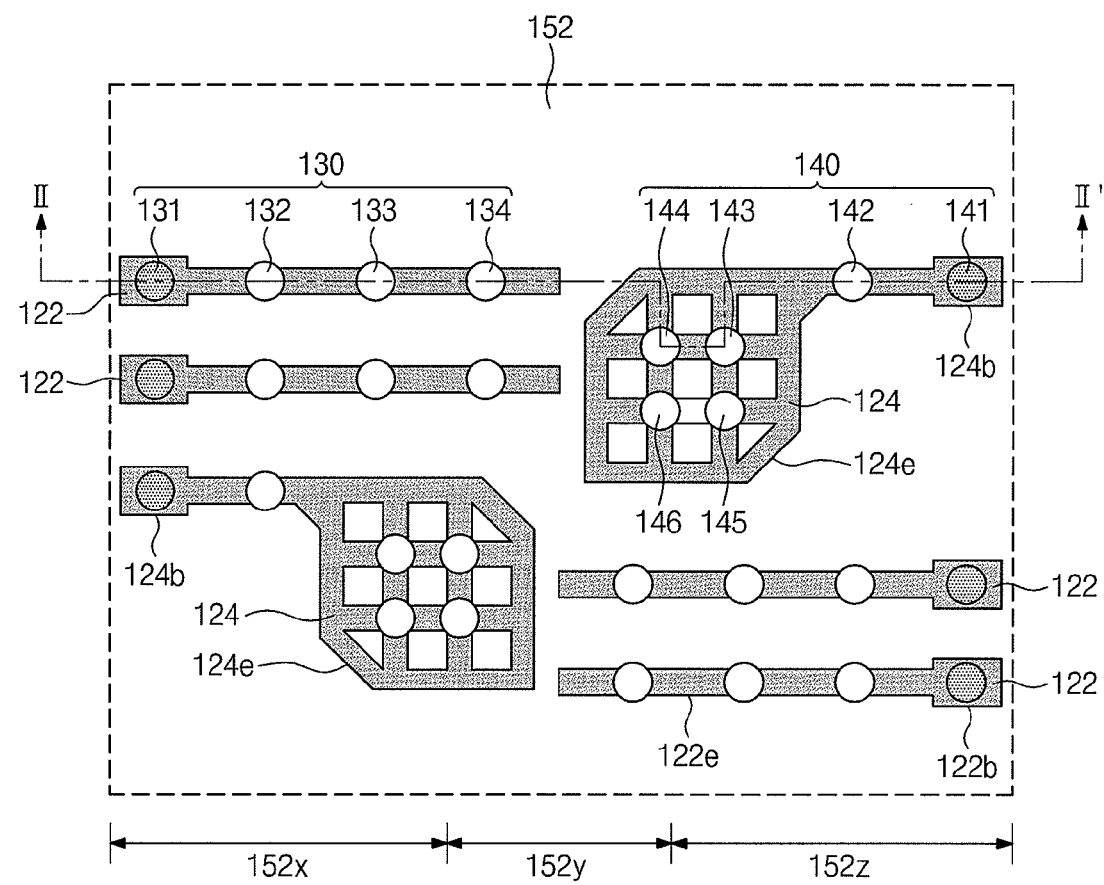
FIG. 2C is a plan view illustrating PCB patterns in a semiconductor package according to an embodiment of the inventive concept.

Referring to FIGS. 2A and 2C, in the signal pattern 122 on the line II-II', the land 122b of the signal pattern 122 may be disposed at the left edge 152x of the semiconductor chip 152, and an extension portion 122e may extend from the left edge 152x to a center 152y. In a power pattern 124 on the line a land 124b of the power pattern 124 may be disposed at a right edge 152z, and an extension portion 124e may extend from the right edge 152z to the center 152y. Thus, a real bump 131 of a first bump group 130 may be disposed at the left edge 152x of the semiconductor chip 152, and dummy bumps 132 to 134 may be disposed at the center 152y and the left edge 152x. The number or density of the dummy bumps 132 to 134 may be uniform irrespective of the left edge 152x and the center 152y. Alternatively, the number or density of the dummy bumps 132 to 134 may vary with the left edge 152x and the center 152y. For example, the number or density of the dummy bumps 132 to 134 at the center 152y may be larger or smaller than that of the dummy bumps 132 to 134 at the left edge 152x. A real bump 141 of a second bump group 140 may be disposed at the right edge 152z of the semiconductor chip 152, and dummy bumps 142 to 146 may be disposed at the center 152y and the right edge 152z of the semiconductor chip 152. The number or density of the dummy bumps 142 to 146 may be uniform irrespective of the right edge 152z and the center 152y. Alternatively, the number or density of the dummy bumps 142 to 146 may vary with the right edge 152z and the center 152y. For example, the number or density of the dummy bumps 142 to 146 at the center 152y may be larger or smaller than that of the dummy bumps 142 to 146 at the right edge 152z.

Figure 2D:
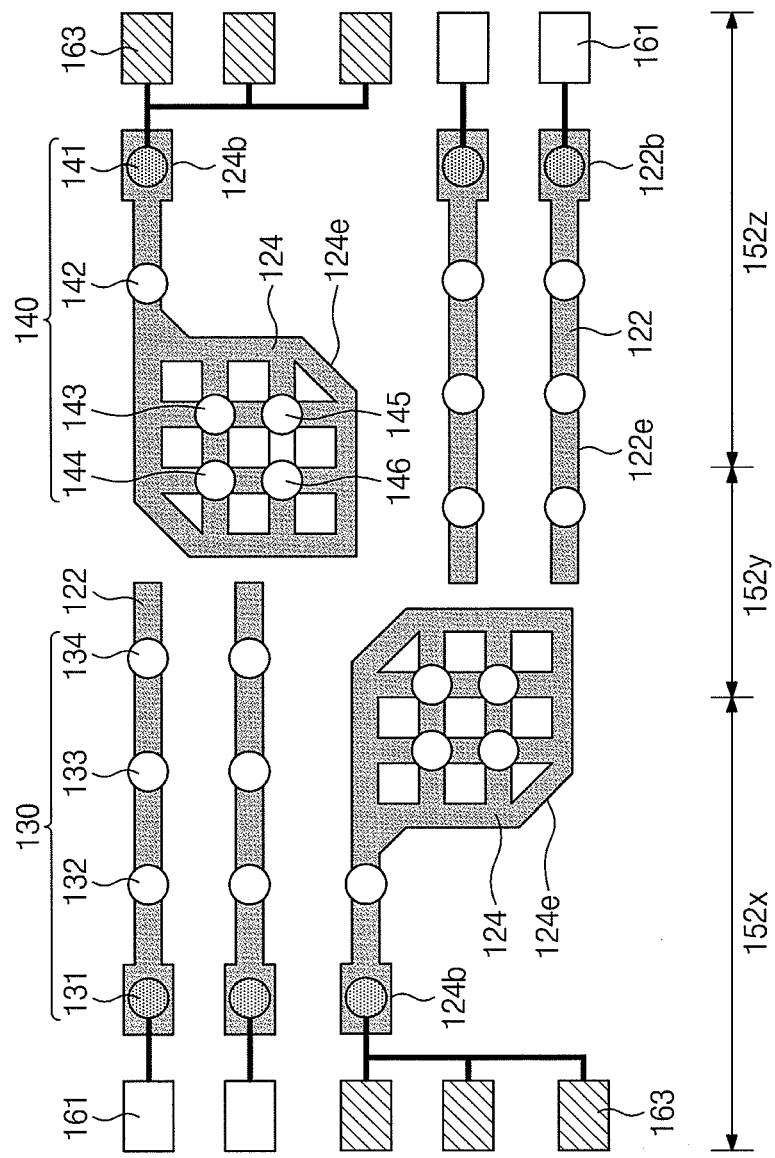
FIG. 2D is a plan view illustrating electrical connections between chip pads and bumps in the semiconductor package of FIG. 1A.

Referring to FIG. 2D, one first bump group 130 may be electrically connected to one edge chip pad 161, and one second bump group 140 may be electrically connected to one or more edge chip pads 163.

Figure 3A:
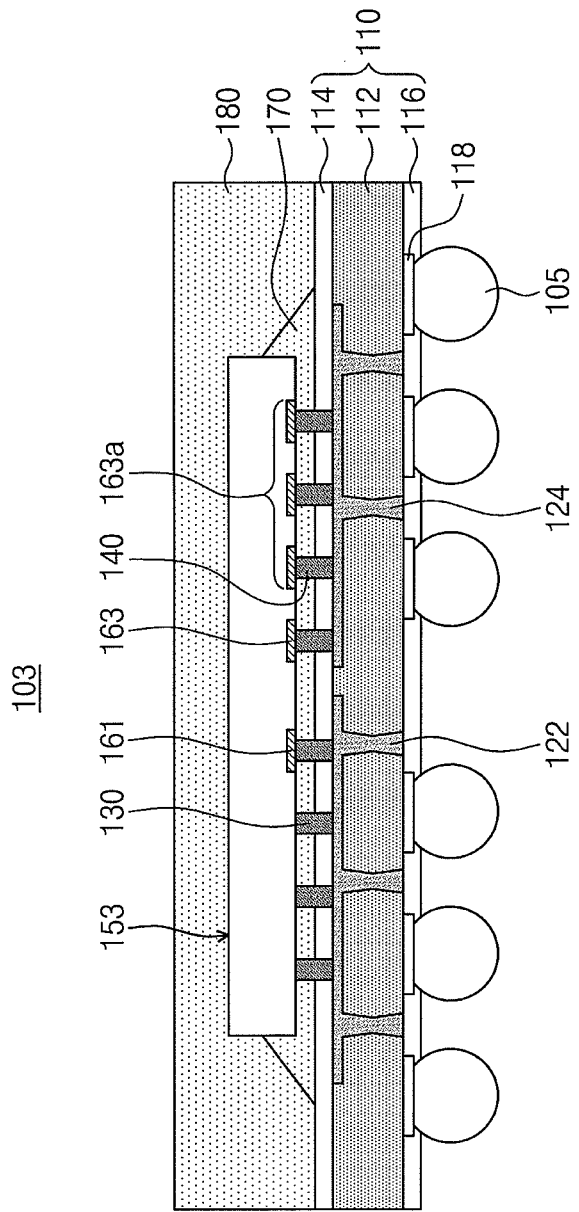
FIG. 3A is a sectional view of a semiconductor package according to an embodiment of the inventive concept.
Figure 3B:
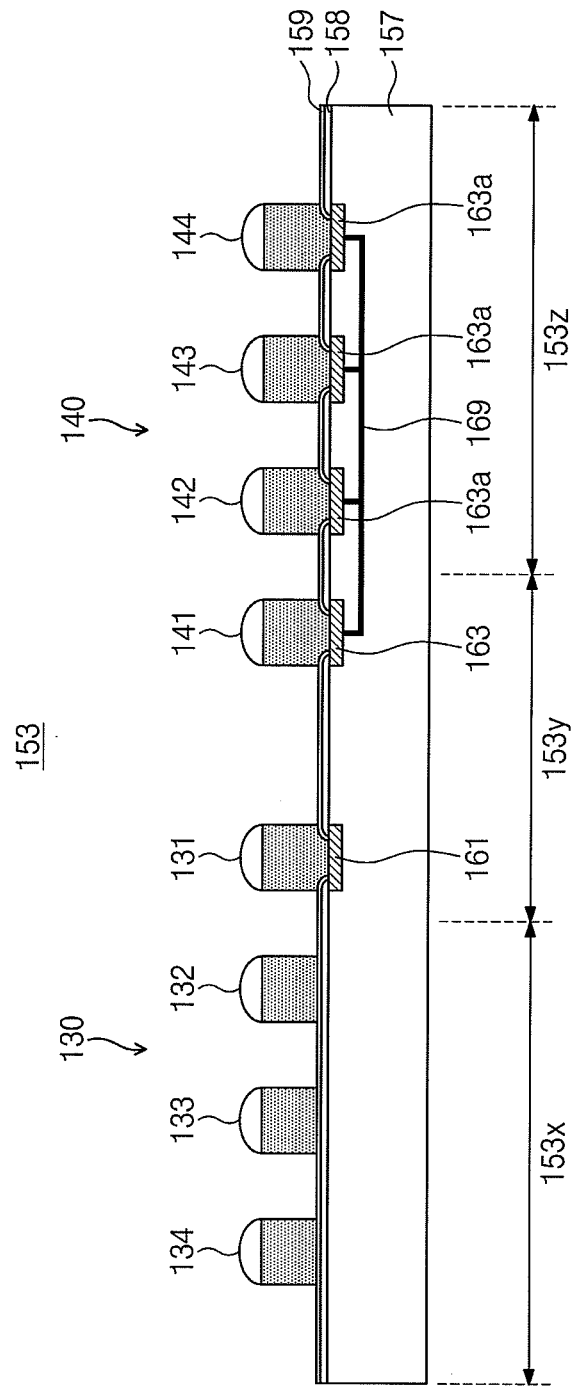
FIG. 3B is a sectional view of a semiconductor chip in a semiconductor package according to an embodiment of the inventive concept.
Figure 3C:
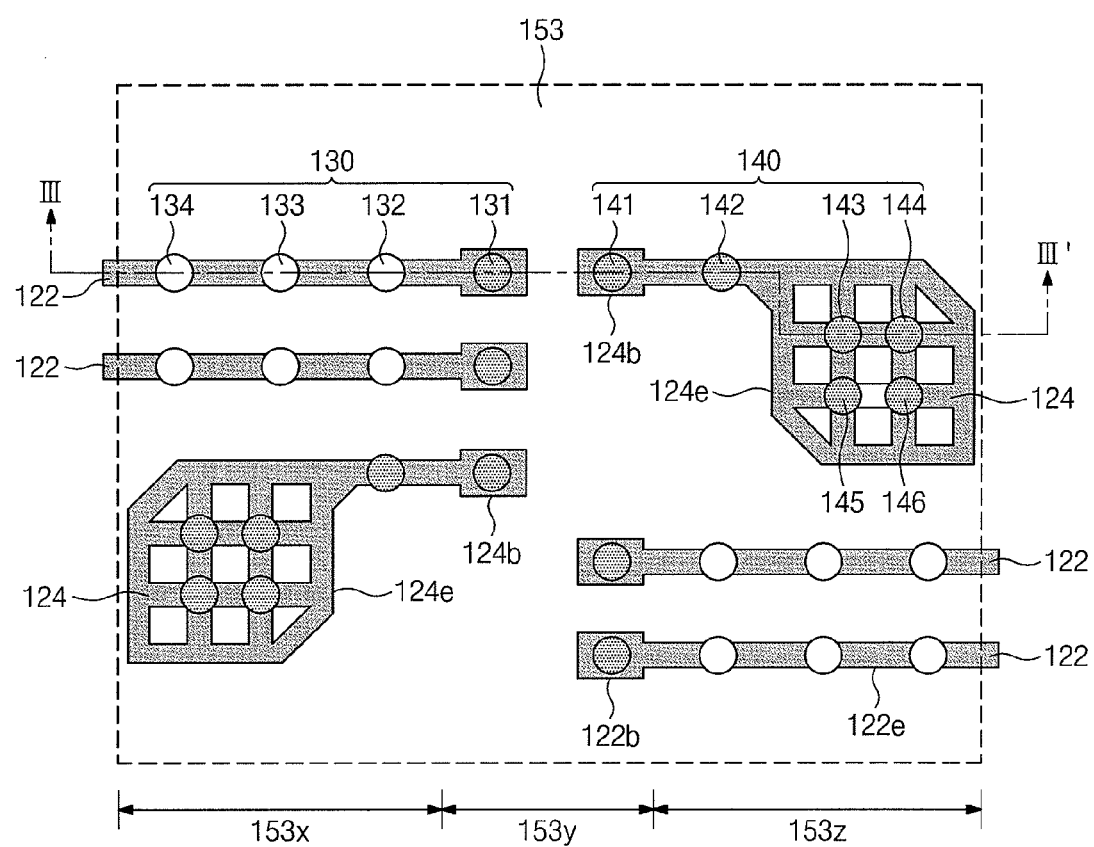
FIG. 3C is a plan view illustrating PCB patterns in a semiconductor package according to an embodiment of the inventive concept.

FIG. 3A is a sectional view of a semiconductor package according to an embodiment of the inventive concept, which is taken along the line of FIG. 3C. FIG. 3B is a sectional view of a semiconductor chip in a semiconductor package according to an embodiment of the inventive concept. FIG. 3C is a plan view illustrating a PCB in a semiconductor package according to an embodiment of the inventive concept.

Referring to FIGS. 3A to 3C, a semiconductor package 103 according to an embodiment of the inventive concept may be a flip-chip package where a semiconductor chip 153 is face-down-mounted on a package substrate 110. The semiconductor package 153 may include the passivation layer 158, the dielectric layer 159, the first bump group 130, and the second bump group 140. The passivation layer 158 and the dielectric layer 159 are disposed on a semiconductor substrate 157. The first bump group 130 and the second bump group 140 electrically and physically connect the semiconductor chip 153 to the package substrate 110. According to an embodiment, the first bump group 130 may connect the signal pattern 122 to the semiconductor chip 153 electrically and physically, and the second bump group 140 may connect the power pattern 124 to the semiconductor chip 153 electrically and physically.

The first bump group 130 may include the real bump 131 and dummy bumps 132 to 134. The real bump 131 is connected to the center chip pad 161 to provide an electrical signal path between the semiconductor chip 153 and the signal pattern 122. The dummy bumps 132 to 134 are not connected to the center chip pad 161 and support the semiconductor chip 153 on the package substrate 110. The first bump group 130 may be in one-to-one correspondence with the center chip pad 161. Thus, as illustrated in FIG. 1E, one first bump group 130 may be electrically to one center chip pad 161. The real bump 131 may be disposed at a center 153y of the semiconductor chip 153, and the dummy bumps 132 to 134 may be disposed at edges 153x and 153z of the semiconductor chip 153. For example, the real bump 131 of the first bump group 130, which is disposed on the signal pattern 122 on the line III-III' of FIG. 3C, may be disposed at the center 153y of the semiconductor chip 153. The dummy bumps 132 to 134 may be disposed at the left edge 153x of the semiconductor chip 153. The dummy bumps 132 to 134 may be used as supporting bumps supporting the left edge 153x of the semiconductor chip 153.

The second bump group 140 may include a real bump 141 electrically connected to the center chip 163 for providing a power delivery path between the semiconductor chip 153 and the power pattern 124 and real bumps 142 to 146 electrically connected to edge chip pads 163a which are electrically connected to the center chip pad 163. All the real bumps 141 to 146 of the second bump group 140 may be electrically connected to each other. In FIG. 3B, a solid line 169 indicates that the chip pads 163 and 163a are electrically connected to each other. The second bump group 140 may be in one-to-one or one-to-many correspondence with the center chip pad 163. As illustrated in FIG. 1E, one second bump group 140 may be electrically connected to one or more center chip pads 163. Among the real bumps 141 to 146, the real bump 141 may be disposed at the center 153y of the semiconductor chip 153, and the other real bumps 142 to 146 may be disposed at the edges 153x and 153z of the semiconductor chip 153. For example, the real bump 141 of the second bump group 140, which is disposed on the power pattern 124 on the line III-III' of FIG. 3C, may be disposed at the center 153y of the semiconductor chip 153. The other real bumps 142 to 146 may be disposed at the right edge 153z of the semiconductor chip 153. For example, the real bumps 142 to 146 on an extension portion 124e of the power pattern 124 may be used as supporting bumps for supporting the right edge 153z of the semiconductor chip 153. In an embodiment, the semiconductor chip 153 may have an edge pad structure where the chip pads 161 and 163 are disposed at the edges 153x and 153z.

Figure 3D:
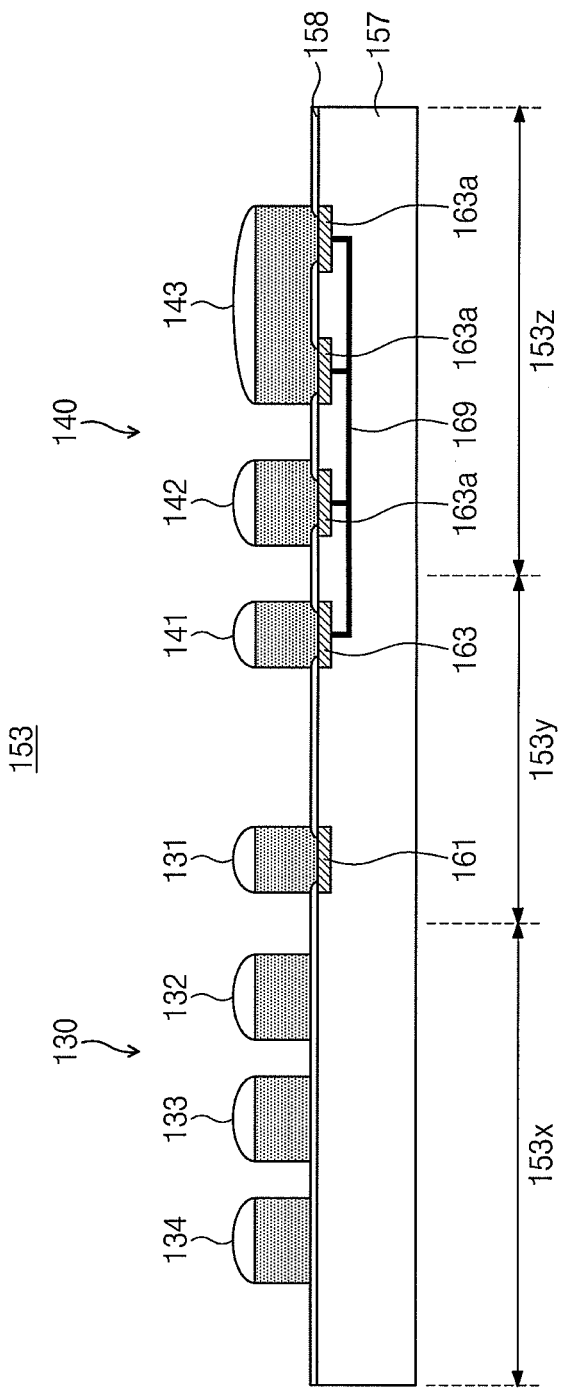
FIG. 3D is a sectional view illustrating an embodiment of the semiconductor chip of FIG. 3B.
Figure 3E:
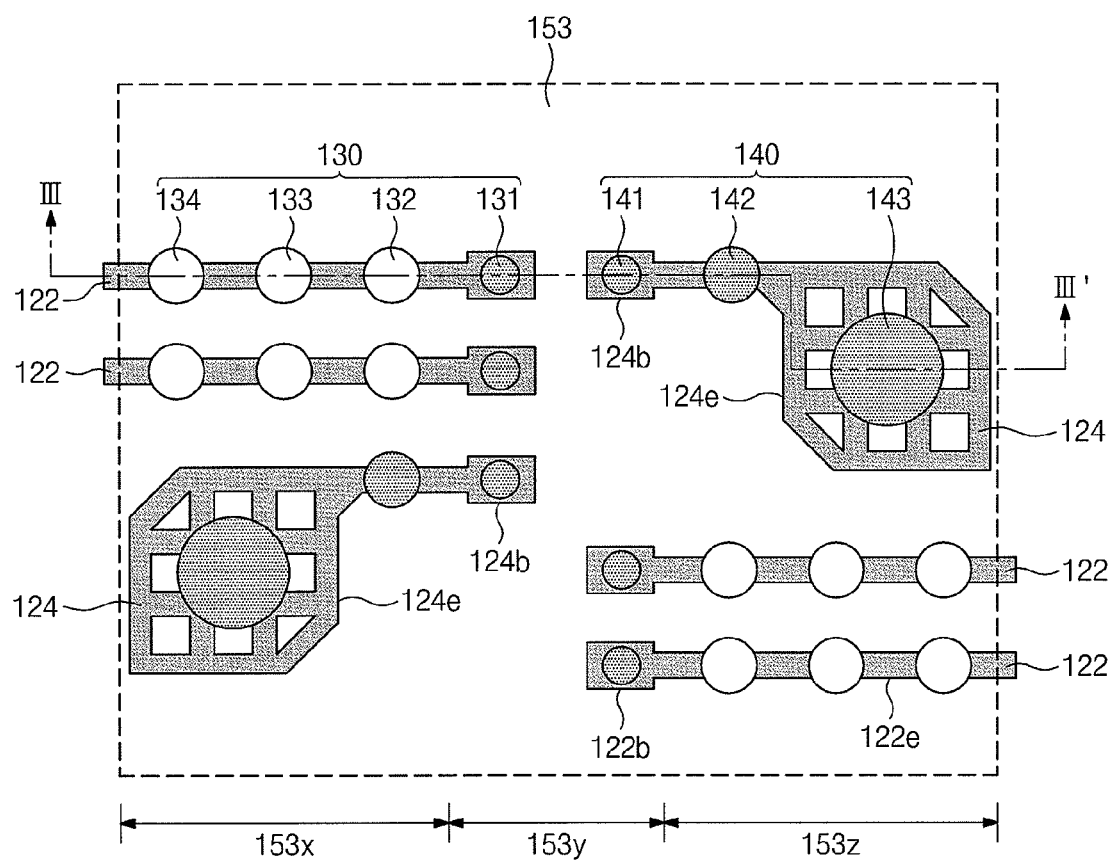
FIG. 3E is a plan view illustrating an embodiment of the PCB patterns of FIG. 3C.

FIG. 3D is a sectional view illustrating an embodiment of the inventive concept. FIG. 3E is a plan view illustrating an embodiment of the PCB patterns of FIG. 3C.

Referring to FIGS. 3D and 3E, the semiconductor chip 153 may not include the dielectric layer 159, and the bumps 131 to 143 may be disposed on the passivation layer 158. In the first bump group 130, the real bump 131 may be different in size from the dummy bumps 132 to 134. For example, to improve a supporting bump function, the dummy bumps 132 to 134 may be larger than the real bump 131. In the second bump group 140, the real bumps 142 and 143 disposed at the edges 153x and 153z may be larger than the real bump 141 disposed at the center 153y of the semiconductor chip 153. For example, the real bump 143 on the extension portion 124e of the power pattern 124 may be formed as a mega-bump connectable to two or more edge chip pads 163a. The large real bumps 142 and 143 can be used as stable supporting bumps of the semiconductor chip 153 and can have effective power delivery functions.

Figure 3F:
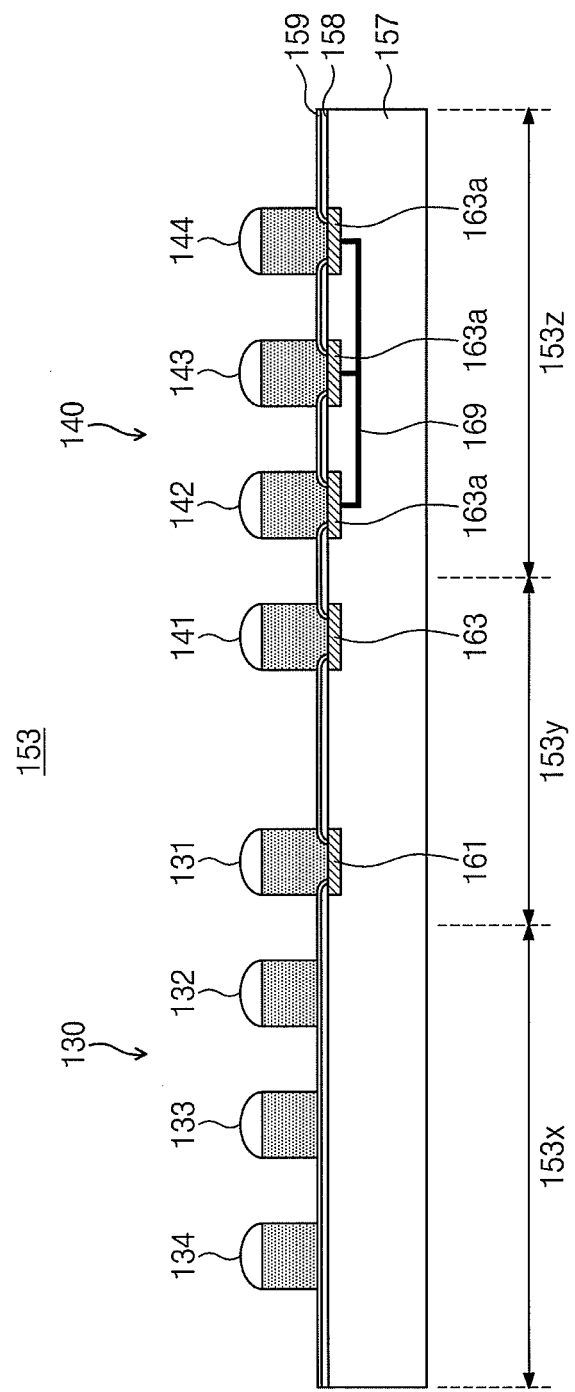
FIG. 3F is a sectional view illustrating an embodiment of the semiconductor chip of FIG. 3B.
Figure 3G:
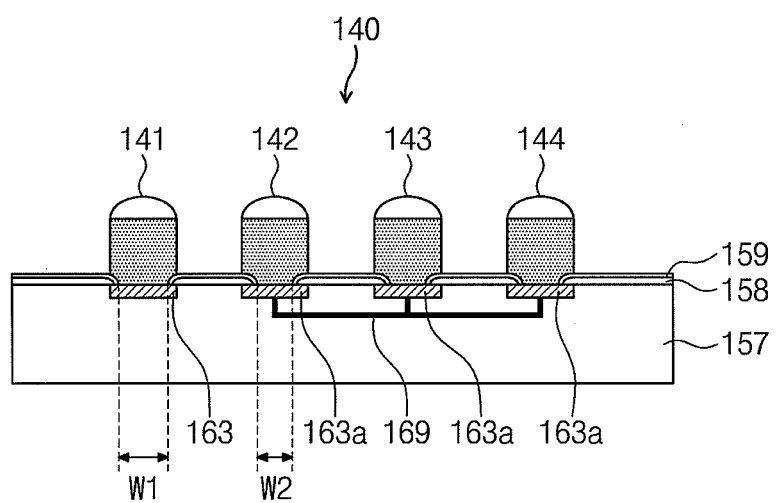
FIG. 3G is an expanded sectional view of a portion of FIG. 3F.

FIG. 3F is a sectional view illustrating an embodiment of the inventive concept. FIG. 3G is an expanded sectional view of a portion of FIG. 3F.

Referring to FIGS. 3F and 3C, the center chip pad 163 connected to the real bump 141 of the second bump group 140 may be a main pad to mainly supply power to the semiconductor chip 153, and the edge chips 163a connected to the other real bumps 142 to 146 may be auxiliary pads to supply an auxiliary power to the semiconductor chip 153. The edge chip pads 163a may be electrically connected to each other. For example, if the second pattern 124 is a power pattern, a sufficient power for a high-speed operation of the semiconductor chip 153 may not be supplied from the power pattern 124 due to a defect in the center chip pad 163. In this case, the auxiliary power may be further supplied from the edge chip pad 163a to the semiconductor chip 153. If the second pattern 124 is a ground pattern, the ground of the semiconductor chip 153 may become unstable due to a defect in the center chip pad 163. In this case, the edge chip pads 163a may be used to stably ground the semiconductor chip 153. In this manner, the edge chip pads 163a are used to reduce a power noise, thereby providing a high-speed operation of the semiconductor chip 153.

Referring to FIGS. 3G and 3C, the center chip pad 163 may be connected to the real bump 141 by a first width W1. The edge chip pad 163a may be connected to each of the real bumps 142 to 146 by a second width W2. Because the edge chip pad 163a is used in auxiliary manner, the area of the edge chip pad 163a exposed through the second width W2 need not be larger than the area of the center chip pad 163 exposed through the first width W1. According to some embodiments of the inventive concept, the second width W2 may be smaller than or equal to the first width W1. A pad formed at a semiconductor chip can be divided into a main pad and an auxiliary pad. A main bump and an auxiliary bump are bonded to the main pad and the auxiliary pad, respectively. The main bump and the auxiliary bump are electrically connected to a power pattern or a ground pattern. Thus, power may be stably supplied and grounded to the semiconductor chip through not only the main pad but also the auxiliary pad. According to some embodiments of the inventive concept, it may not be necessary to additionally form a power pattern/ground pattern electrically connected to the main bump and the auxiliary bump or to change a pre-formed power pattern/ground pattern. The main bump 141 and auxiliary bumps 142 to 144 may be connected to a power pattern 124 without changing the design of the power pattern 124. Moreover, the auxiliary bumps 142 to 146 may serve to ensure stable power supply and serve as support bumps. According to an embodiment, it is not necessary to change the design of the ground pattern 124. Furthermore, the auxiliary bumps 142 to 146 connected to the ground pattern 124 may serve to ensure stable ground and serve as supporting bumps.

In an embodiment, the center chip pad 163 connected to the real bump 141 and the edge chip pad 163a connected to the real bump 142 may be electrically connected to each other to provide the main pads. Also, the edge chip pads 163a connected to the other real bumps 143 to 146 may be electrically connected to each other to provide the auxiliary pads.

Figure 3I:
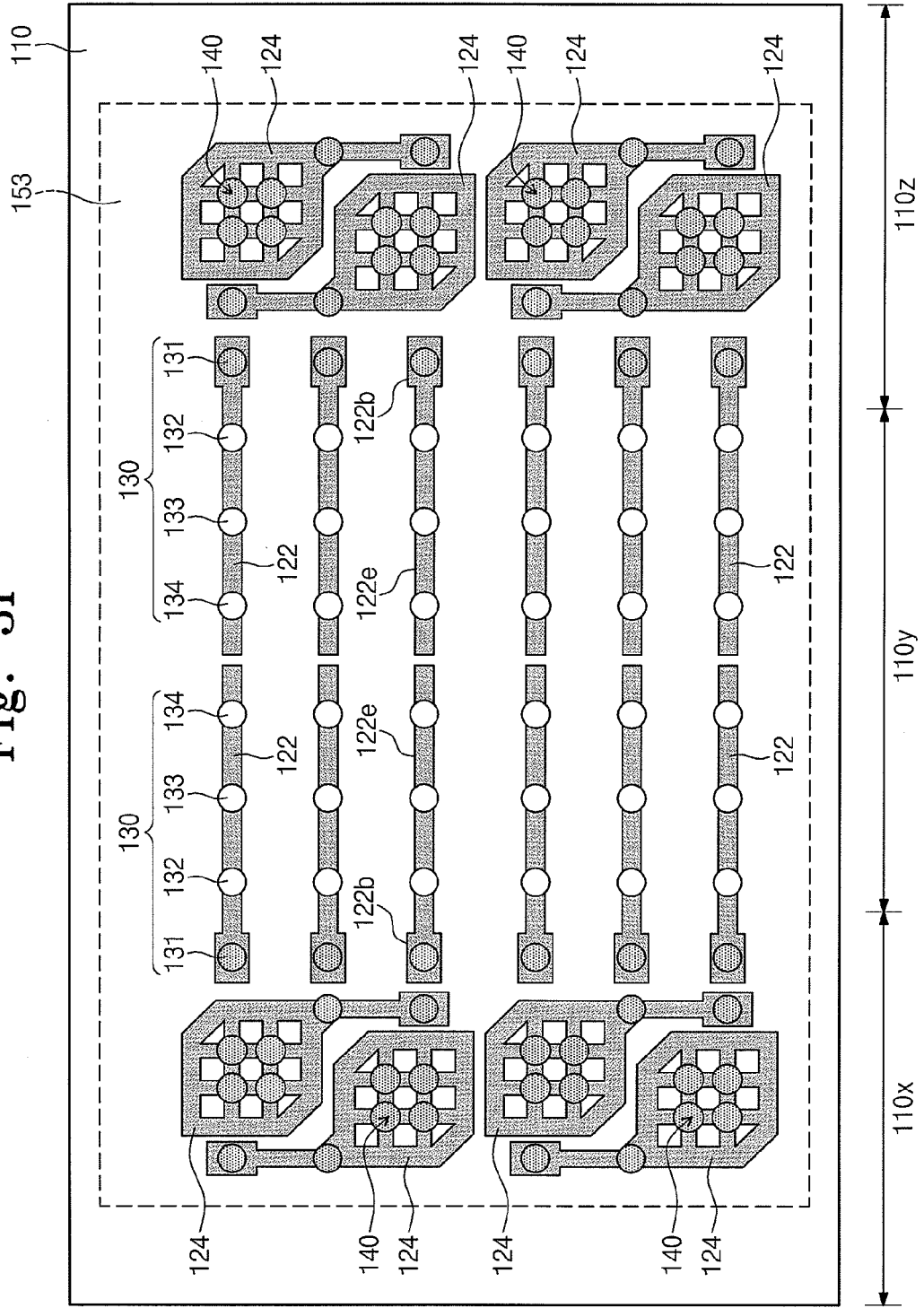

FIGS. 3H and 3I are plan views illustrating some embodiments of the PCB patterns of FIG. 3C.

Referring to FIG. 3H, the semiconductor chip 153 may have a center pad structure. In this case, the power pattern 124 may be arranged to be concentrated along a line at a center 110y of the package substrate 110, with the signal pattern 122 distributed at left and right edges 110x and 110z thereof. For example, the land 122b may be disposed at the center 110y of the package substrate 110, and the extension portion 122e may extend from the center 110y to the left edge 110x or to the right edge 110z thereof. This exemplary embodiment may be useful if at least one of the signal pattern 122 and the power pattern 124 is concentrated at some portion of the package substrate 110.

Referring to FIG. 3I, the semiconductor chip 153 may have an edge pad structure. In this case, the power pattern 124 may be arranged to be concentrated along lines at the left and right edges 110x and 110z of the package substrate 110, with the signal pattern 122 distributed at the center 110y thereof. For example, the extension portion 122e may extend from the left edge 110x or from the right edge 110z to the center 110y of the package substrate 110, and the land 122b may be disposed at the left edge 110x or the right edge 110z thereof. According to this exemplary embodiment, the second bump group 140 may supply power to the semiconductor chip 153 and also support the edges of the semiconductor chip 153 on the package substrate 110.

Figure 4A:
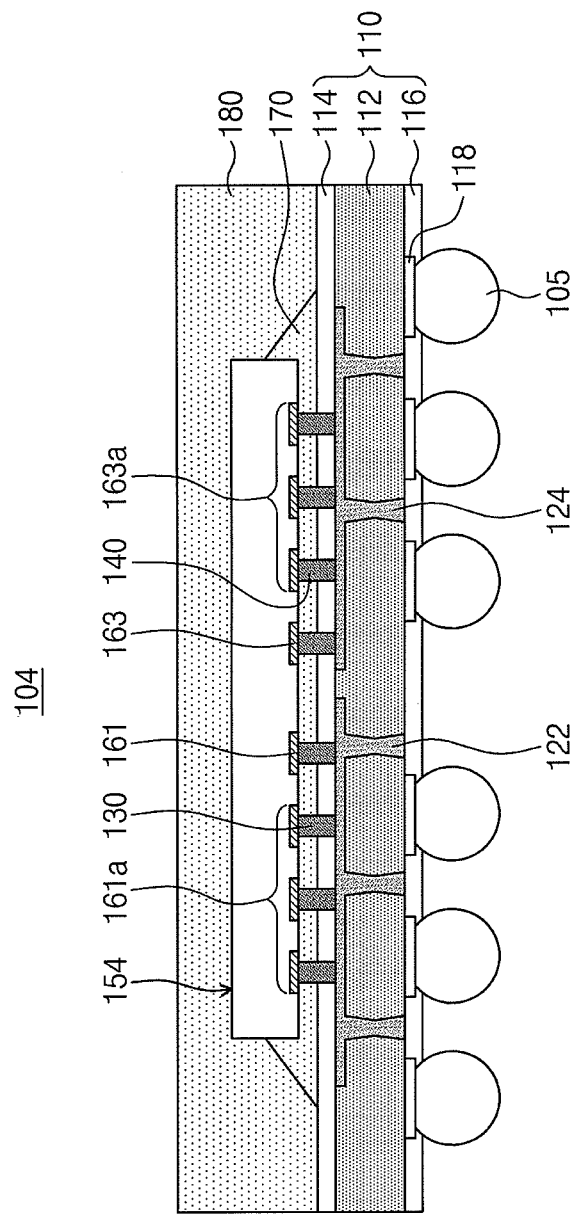
FIG. 4A is a sectional view of a semiconductor package according to an embodiment of the inventive concept.
Figure 4B:
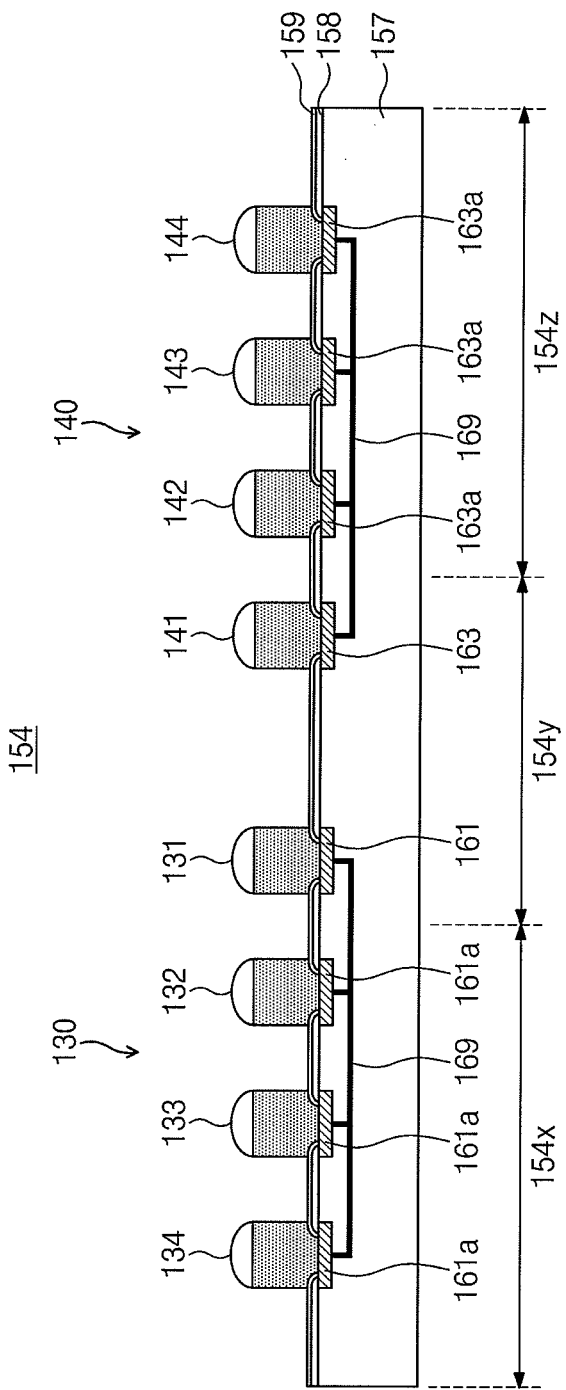
FIG. 4B is a sectional view of a semiconductor chip in a semiconductor package according to an embodiment of the inventive concept.
Figure 4C:
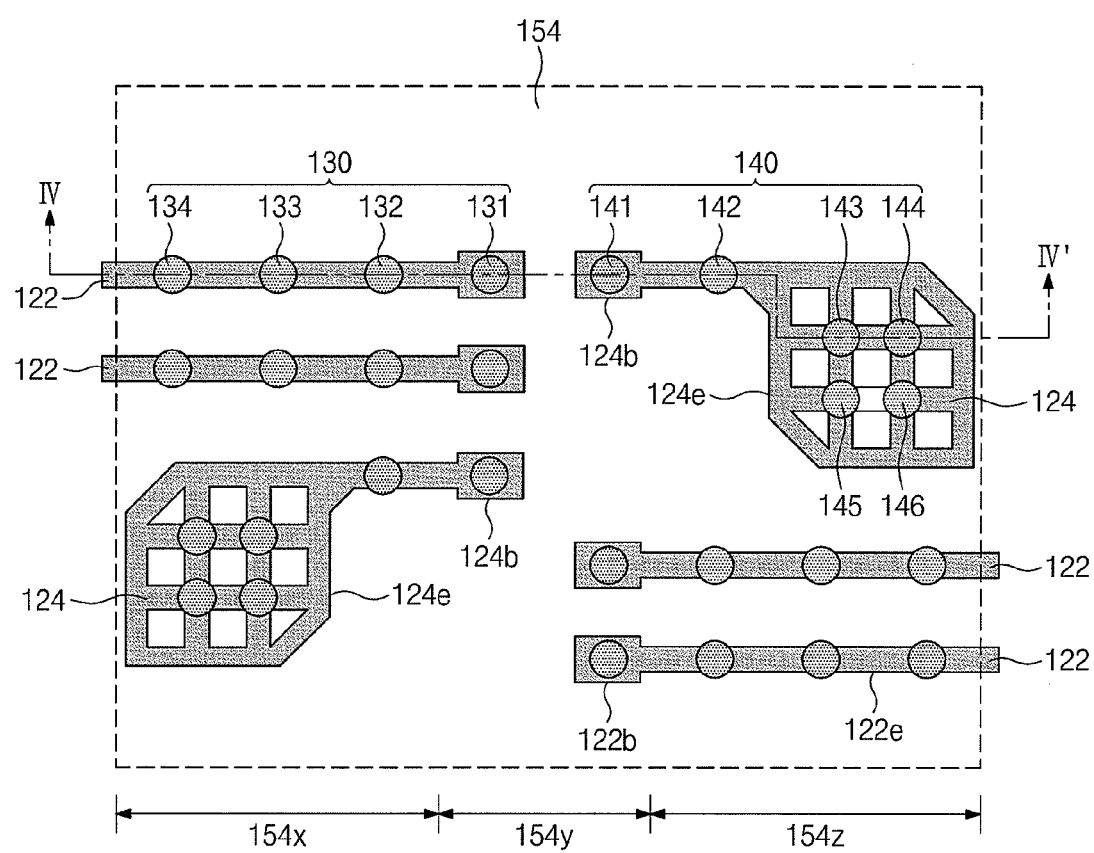
FIG. 4C is a plan view illustrating PCB patterns in a semiconductor package according to an embodiment of the inventive concept.

FIG. 4A is a sectional view of a semiconductor package according to an embodiment of the inventive concept, which is taken along the line IV-IV' of FIG. 4C. FIG. 4B is a sectional view of a semiconductor chip in a semiconductor package according to an embodiment of the inventive concept. FIG. 4C is a plan view illustrating a PCB in a semiconductor package according to an embodiment of the inventive concept.

Referring to FIGS. 4A to 4C, a semiconductor package 104 according to an embodiment of the inventive concept may be a flip-chip package where a semiconductor chip 154 is face-down-mounted on a package substrate 110. The semiconductor package 154 may include the passivation layer 158, the dielectric layer 159, the first bump group 130, and the second bump group 140. The passivation layer 158 and the dielectric layer 159 are disposed on a semiconductor substrate 157. The first bump group 130 and the second bump group 140 electrically connect the semiconductor chip 154 to the package substrate 110. According to an embodiment, the first bump group 130 may electrically connect the signal pattern 122 to the semiconductor chip 154, and the second bump group 140 may electrically connect the power pattern 124 to the semiconductor chip 154.

The first bump group 130 may include a bump 131 electrically connected to a center chip pad 161 and bumps 132 to 134 electrically connected to edge chip pads 161a. The edge chip pads 161a may be electrically connected to the center chip pad 161. All the bumps 131 to 134 of the first bump group 130 may be real bumps providing electrical signal paths between the semiconductor chip 154 and the signal pattern 122. All the real bumps 131 to 134 may be connected to the extension portion 122e and the land 122b of the signal pattern 122. For example, the real bump 131 of the first bump group 130, which is disposed on the signal pattern 122 on the line IV-IV' of FIG. 4C, may be connected to the land 122b disposed at a center 154y of the semiconductor chip 154. The other real bumps 132 to 134 may be connected to the extension portion 122e disposed at a left edge 154x of the semiconductor chip 154.

The second bump group 140 may include a bump 141 electrically connected to a center chip pad 163 and bumps 142 to 146 electrically connected to edge chip pads 163a. The edge chip pads 163a may be connected electrically to the center chip pad 163. All the bumps 141 to 146 of the second bump group 140 may be real bumps to provide power delivery paths between the semiconductor chip 154 and a power pattern 124. All the real bumps 141 to 146 may be connected to the extension portion 124e and the land 124b of the power pattern 124. For example, the real bump 141 of the second bump group 140, which is disposed on the power pattern 124 along the line IV-IV' of FIG. 4C, may be disposed at the land 124b disposed at the center 154y of the semiconductor chip 154. The other real bumps 142 to 146 may be connected to the extension portion 124e disposed at the right edge 154z of the semiconductor chip 154. A plurality of real bumps 141 to 146 are connected to one power pattern 124, thus an effective power delivery can be achieved.

The chip pads 161 and 163a may be formed in a matrix configuration at the center 154y and the edges 154x and 154z of the semiconductor chip 154. Likewise, the first bump group 130 and the second bump group 140 may be disposed in a matrix configuration throughout the semiconductor chip 154. Therefore, the semiconductor chip 154 can be stably connected on the package substrate 110, thus having a structure strong to a mechanical stress. Even when some of the bumps 131 to 134 connected to the signal pattern 122 cannot be used as an electrical signal path, because the other bumps can be provided as an electrical signal path, the electrical characteristics can be improved. The same is true of the power pattern 124.

The first bump group 130 may be in one-to-one correspondence with the center chip pad 161. Thus, one first bump group 130 may be electrically connected to one center chip pad 161. The second bump group 140 may be in one-to-one or one-to-many correspondence with the center chip pad 163. Thus, one second bump group 140 may be electrically connected to one or more center chip pads 163.

Figure 4D:
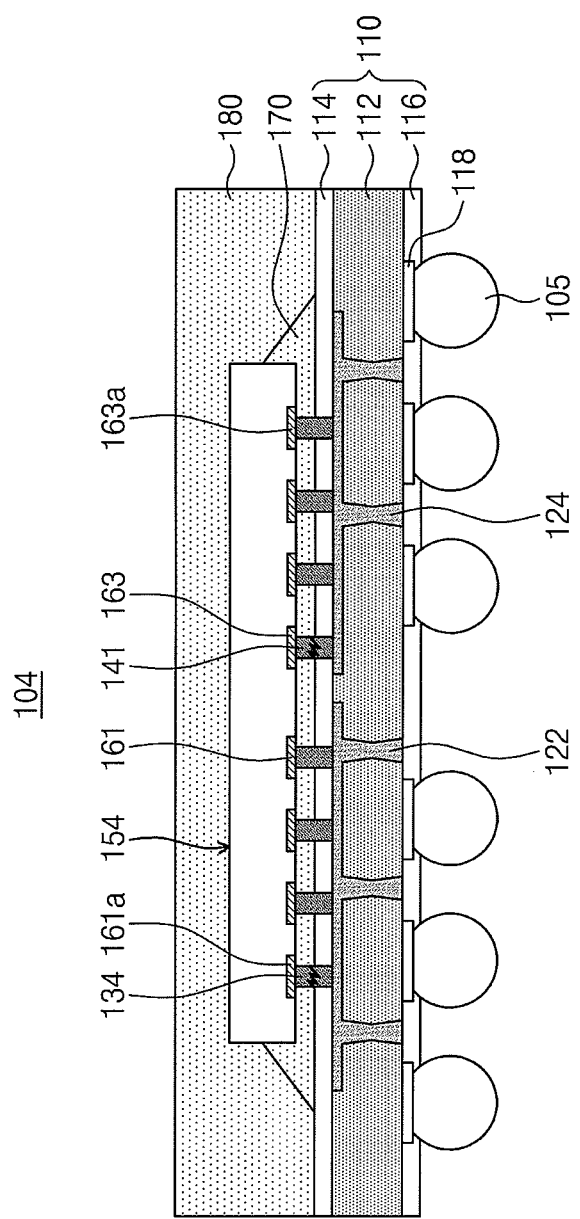
FIG. 4D is a sectional view illustrating an example of a crack in a bump in a semiconductor package.
Figure 4E:
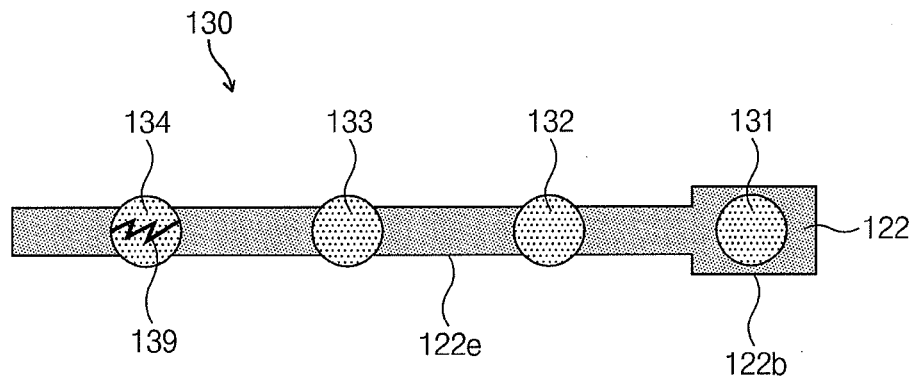
FIG. 4E is a plan view illustrating an example of a crack in some bumps of a first bump group in a semiconductor package.
Figure 4F:
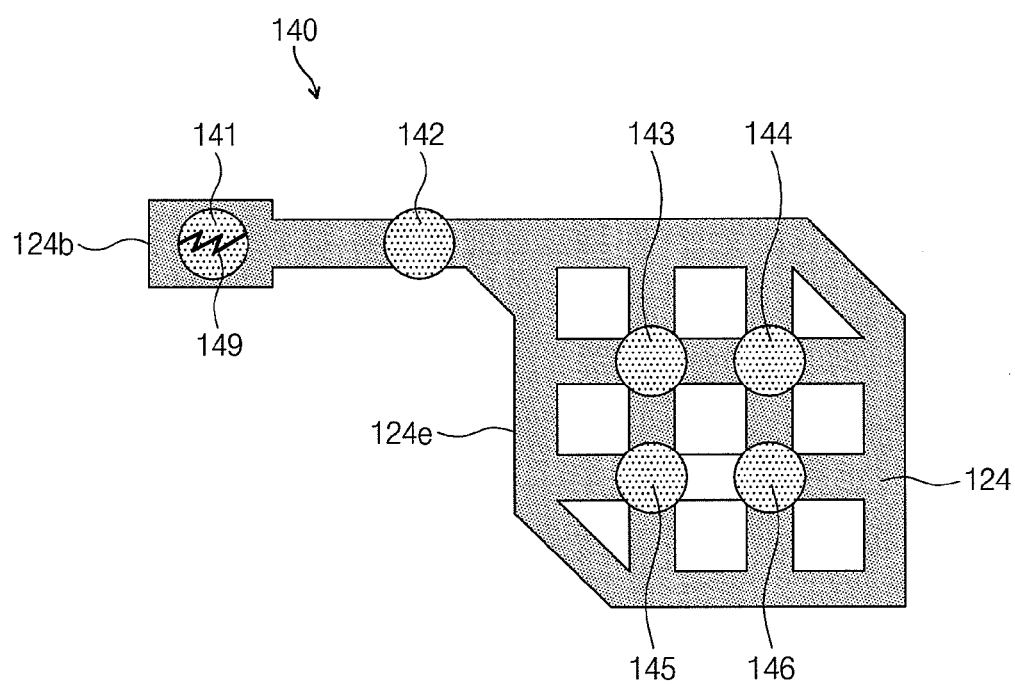
FIG. 4F is a plan view illustrating an example of a crack in some bumps of a second bump group in a semiconductor package.

FIG. 4D is a sectional view illustrating an example of a crack in a bump in the semiconductor package of FIG. 4A. FIG. 4E is a plan view illustrating an example of a crack in a bump of the first bump group. FIG. 4F is a plan view illustrating an example of a crack in a bump of the second bump group.

Referring to FIGS. 4D and 4E, when a mechanical and/or thermal stress is applied to the semiconductor package 104, cracks may occur in a bump of the first bump group 130. For example, if a crack 139 occurs in the real bump 134 connected to the extension portion 122e of the signal pattern 122, an electrical signal may not be transmitted through the real bump 134. However, the electrical signal can be transmitted through the other real bumps 131 to 133, thereby preventing the poor transmission of the electrical signal.

Referring to FIGS. 4D and 4F, a crack 149 may occur in the real bump 141 connected to the land 124b of the power pattern 124, thus preventing the power delivery or increasing the resistance. In this case, the power can be delivered through the other real bumps 142 to 146, thus enabling a smooth power supply.

FIGS. 4G to 4J are sectional views illustrating various structures of a semiconductor chip in a semiconductor package according to embodiments of the inventive concept.

Figure 4G:
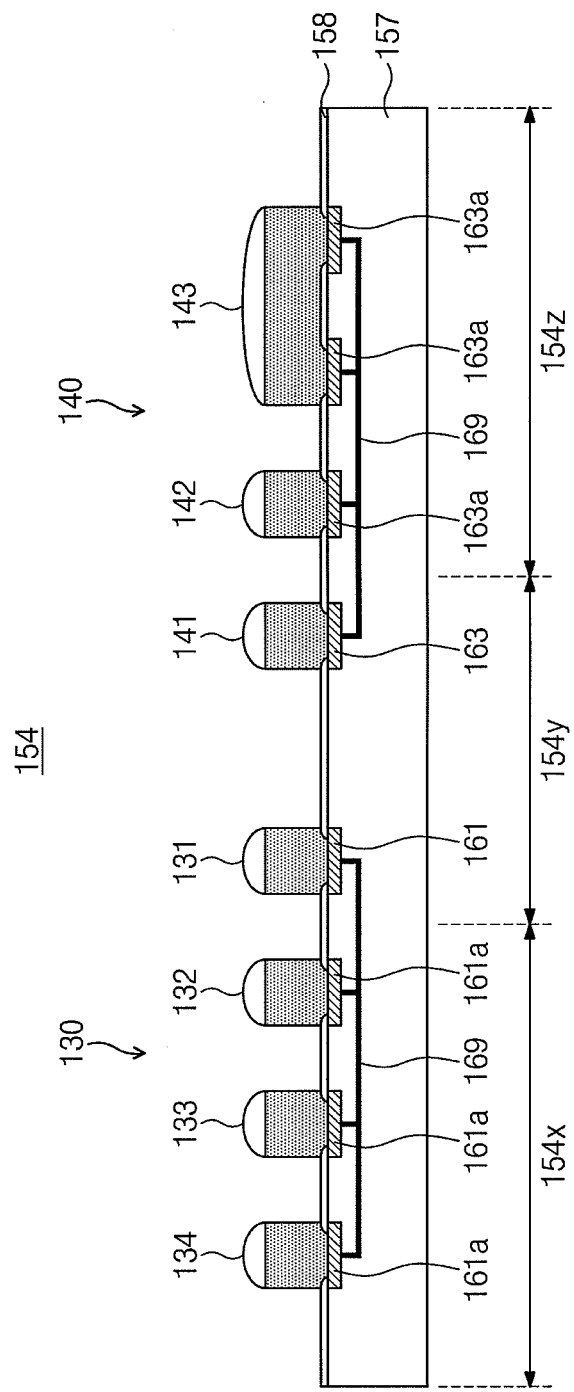
FIGS. 4G to 4J are sectional views illustrating various structures of a semiconductor chip in a semiconductor package according to embodiments of the inventive concept.

Referring to FIGS. 4C and 4G, the dielectric layer 159 may not be disposed on the passivation layer 158 of the semiconductor chip 154. In this case, the passivation layer 158 may define lands for the bumps 131 to 146. The real bump 143 of the second bump group 140, which is connected to the extension portion 124e of the power pattern 124, may be larger than other real bumps 141 and 142. For example, the real bump 143 may be a mega-bump connectable to two or more edge chip pads 163a. This mega-bump 143 can increase the connection area between the power pattern 124 and the semiconductor chip 154, thereby implementing effective power delivery and improve the supporting capability for the semiconductor chip 154.

Figure 4H:
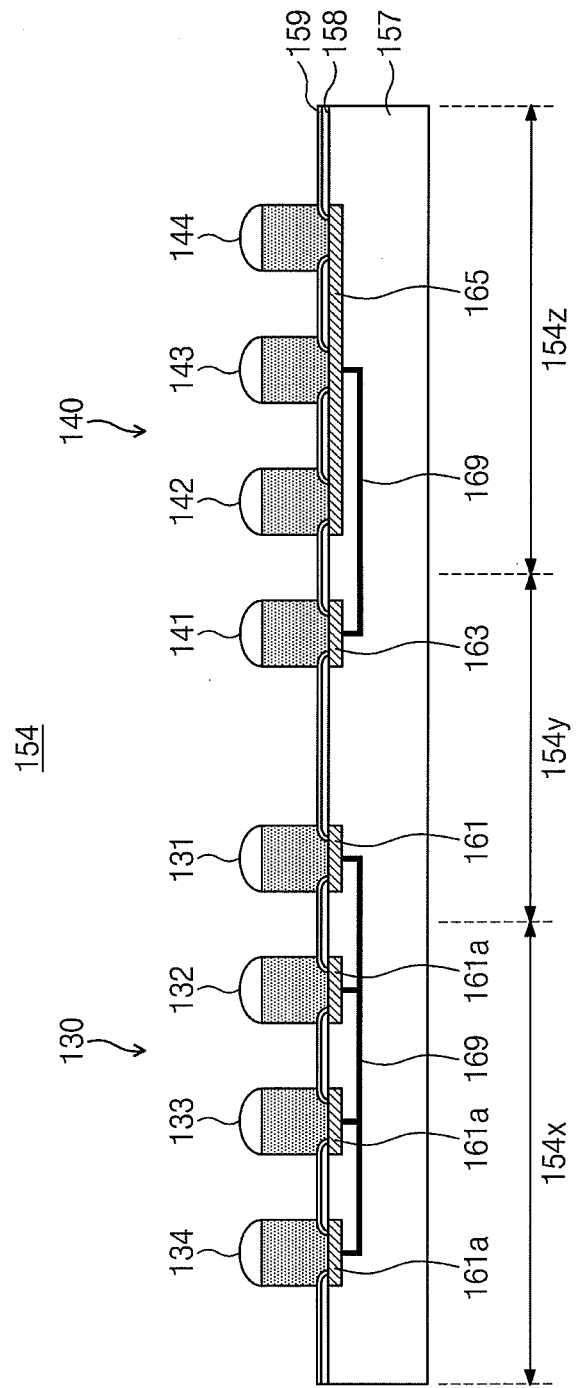

Referring to FIGS. 4C and 4H, some real bumps of the second bump group 140, for example, the real bumps 142 to 146 connected to the extension portion 124e of the power pattern 124 may be connected in common to a power metal 165 in the semiconductor chip 154. In this case, the electrical reliability and the power delivery characteristics can be improved.

Figure 4I:
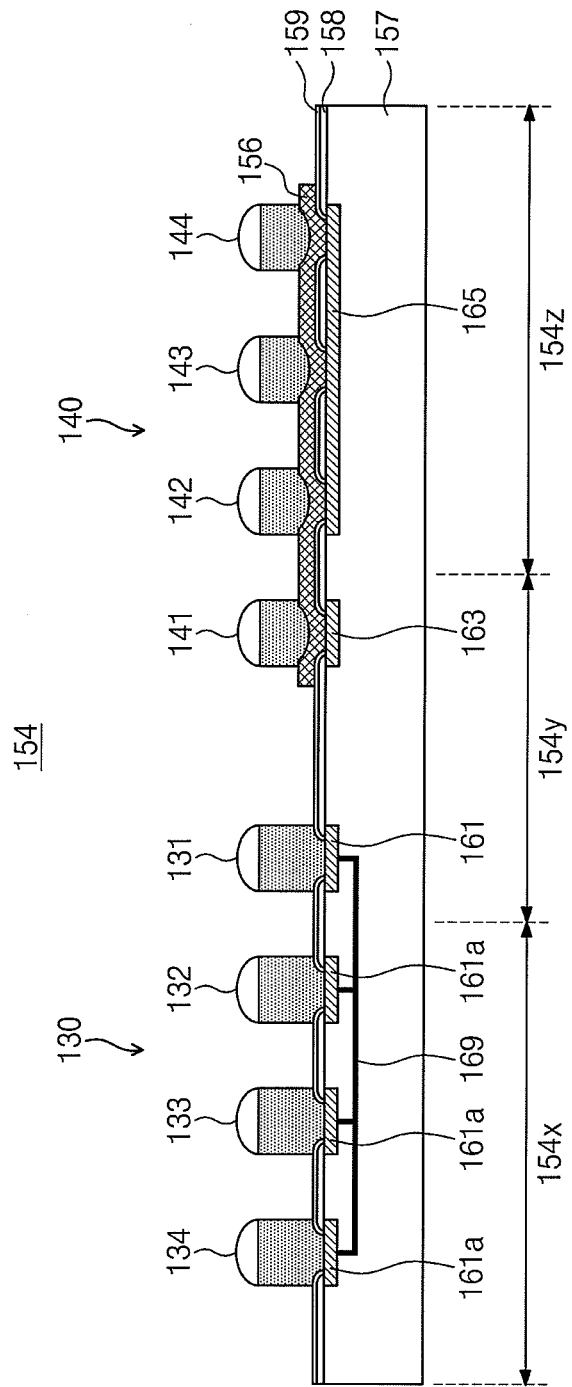

Referring to FIGS. 4C and 4I, the second bump group 140 may be disposed on a redistribution line 156. For example, all the real bumps 141 to 146 of the second bump group 140 may be disposed on one redistribution line 156 such that they are electrically connected to each other. The center chip pad 163 and the power metal 165 may not be electrically connected in a direct manner. The structure of the redistribution line 156 may also be applicable to the first bump group 130.

Figure 4J:
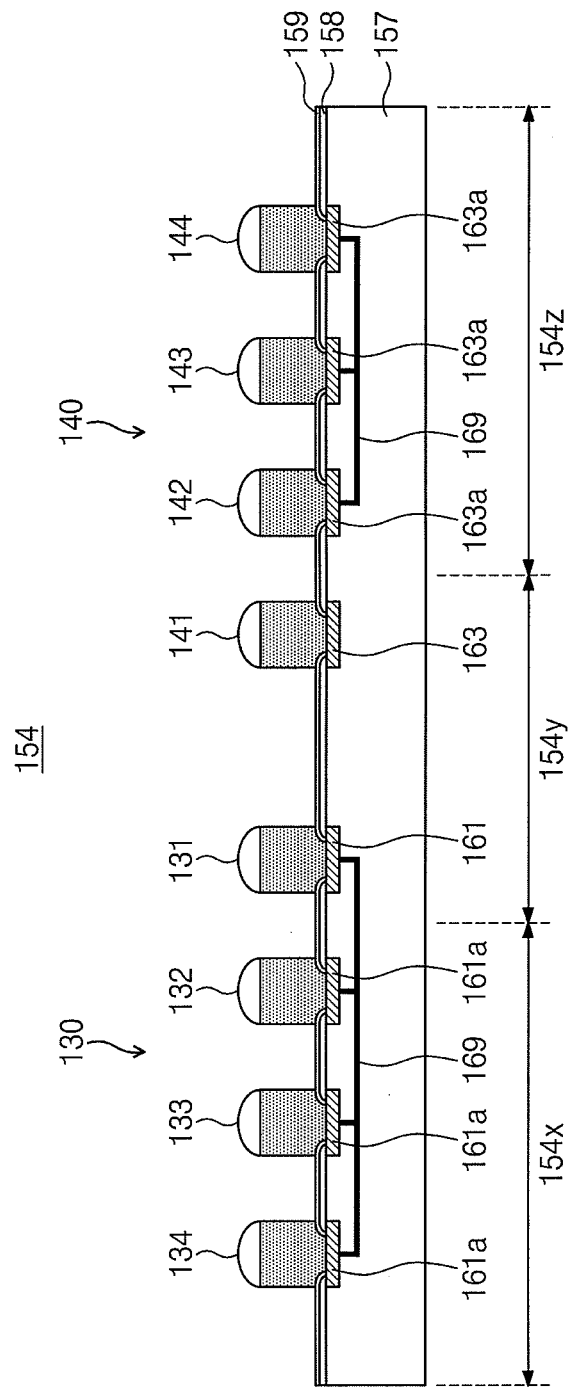

Referring to FIGS. 4C and 4J, as described with reference to FIGS. 3F and 3G, the center chip pad 163 connected to the real bump 141 of the second bump group 140 may be a main pad for supplying a main power (or for a main ground), and the edge chip pad 163a connected to the other real bumps 142 to 146 may be an auxiliary pad for supplying an auxiliary power (or for an auxiliary ground). The chip pads 161 and 161a connected to the first bump group 130 may all be main pads.

FIGS. 5A to 5D are sectional views illustrating a semiconductor package fabrication method according to an embodiment of the inventive concept. FIGS. 6A to 6B are plan views illustrating a semiconductor package fabrication method according to an embodiment of the inventive concept.

Figure 5A:
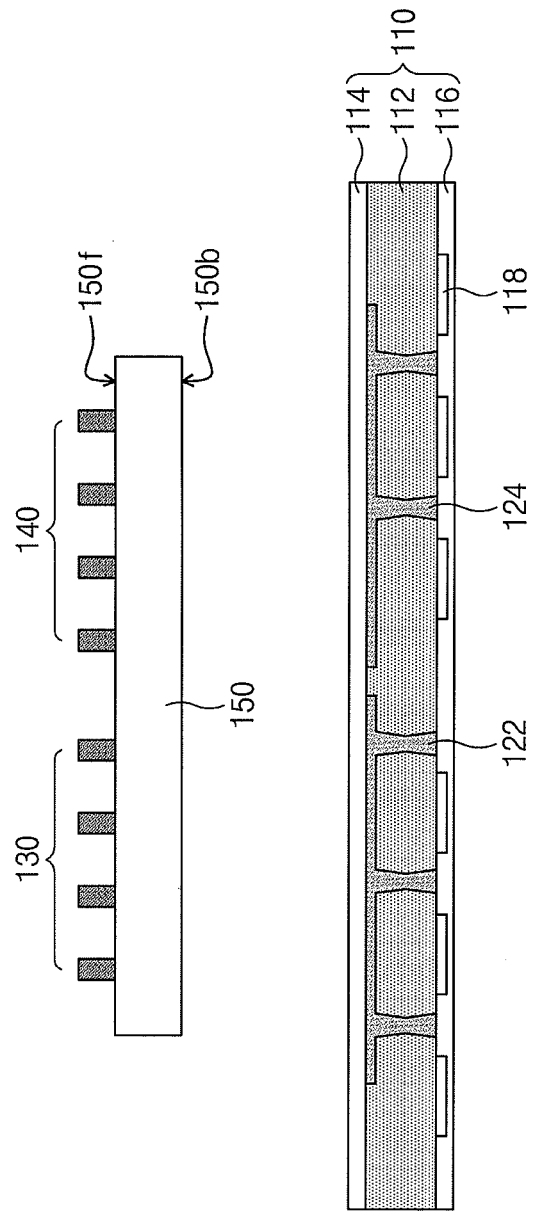
Figure 6A:
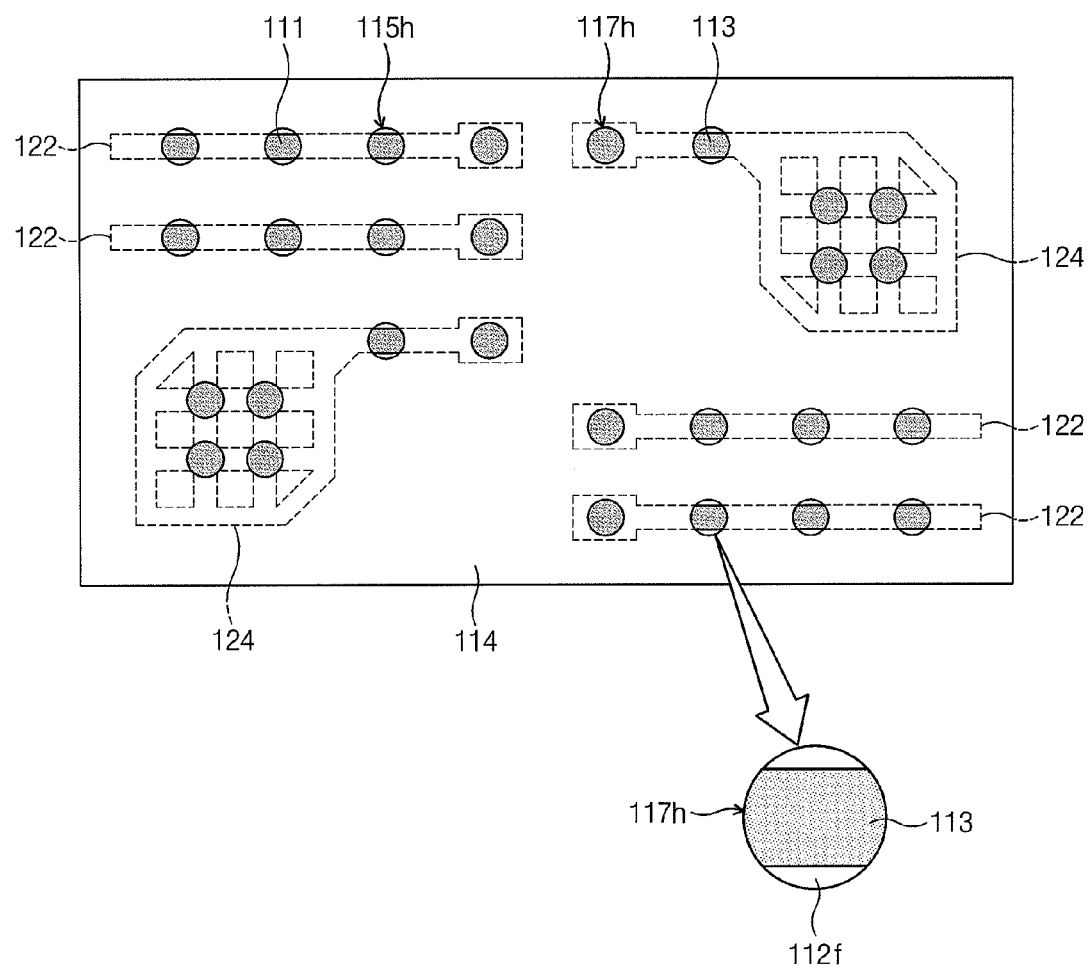
FIGS. 6A and 6B are plan views illustrating a method of a semiconductor package according to an embodiment of the inventive concept.
Figure 6B:
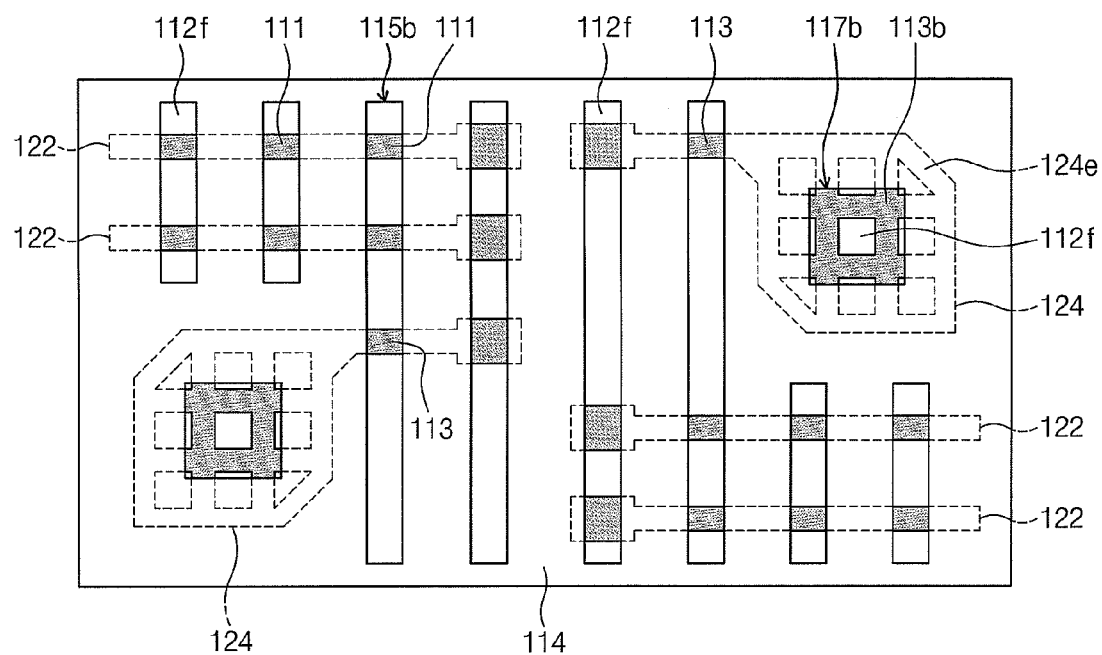

Referring to FIG. 5A, a semiconductor chip 150 to be mounted on a package substrate 110 may be provided. The package substrate 110 may be a PCB in which an upper dielectric layer 114 and a lower dielectric layer 116 are formed respectively on upper and lower surfaces of a core 112. The core 112 may be formed of fiber-reinforced glass or epoxy resin. The upper dielectric layer 114 and the lower dielectric layer 116 may be formed of photo solder resist (PSR). A PCB pattern including a copper-clad signal pattern 122 and a power pattern 124 may be formed on a top surface of the package substrate 110, and a substrate pad 118 formed of metal such as, for example, copper and aluminum may be formed on a bottom surface of the package substrate 110.

The semiconductor chip 150 may include a first bump group 130 and a second bump group 140 formed on a top surface 150f of the semiconductor chip 150. The first bump group 130 may be connected to the signal pattern 122, and the second bump group 140 may be connected to the power pattern 124. The number and locations of the bump of the first bump group 130 may depend on the routing of the power pattern 124. Each of the first bump group 130 and the second bump group 140 may include a plurality of bumps, and all of the bumps may be real bumps in an embodiment. In an embodiment, at least one of the bumps may be real bump and the other may be a dummy bump. The semiconductor chip 150 may have a center pad structure of FIG. 1B, an edge pad structure of FIG. 2B, or a matrix pad structure of FIG. 4B. For example, providing the semiconductor chip 150 may include forming the passivation layer 158 and the dielectric layer 159, which open center chip pads 161 and 163, on a semiconductor substrate 157 having the center chip pads 161 and 163 formed on its center 150y as illustrated in FIG. 1B. Then, a first bump group 130 and a second bump group 140 are formed on the dielectric layer 159 by, for example, plating or deposition of copper and/or solder. Real bumps 131 and 141 may be connected to the center chip pads 161 and 163.

Referring to FIG. 5B, the upper dielectric layer 114 may be patterned to form a plurality of openings 115 and 117, and the semiconductor chip 150 may be facedown-mounted on the package substrate 110. Thus, the semiconductor chip 150 may be facedown-mounted in a flip state where a top surface 150f is directed downward to the package substrate 110 and a bottom surface 150b is directed upward. The openings 115 and 117 may include a plurality of first openings 115 partially opening the signal pattern 122, and a plurality of second openings 117 partially opening the power pattern 124. First lands 111 connected to the first bump group 130 may be defined by the first openings 115, and second lands 113 connected to the second bump group 140 may be defined by the second openings 117. The openings 115 and 117 may be formed in the shape of holes 115h and 117h as illustrated in FIG. 6A, or may be formed in the shape of blocks 115b and 117b as illustrated in FIG. 6B.

Referring to FIG. 6A, the holes 115h and 117h may include a plurality of first holes 115h opening the signal pattern 122 to define the first lands 111, and a plurality of second holes 117h opening the power pattern 124 to define the second lands 113. The first holes 115h and the second holes 117h may have similar sizes or the same size. A top surface 112f of the core 112 may be exposed according to the size of the holes 115h and 117h.

Referring to FIG. 6B, the blocks 115b and 117b may include a first block 115b extending in one direction, and a second block 117b having, for example, a substantially square shape. The first block 115b may have a line shape extending in the direction (e.g., the vertical direction) substantially perpendicular to the extending direction (e.g., the horizontal direction) of the signal pattern 122. Accordingly, a plurality of first lands 111 or a plurality of first and second lands 111 and 113 may be simultaneously defined by one first block 115b. The second block 117b may define a third land 113b opening the extension portion 124e of the power pattern 124. The third land 113b may be larger in area than the first and second lands 111 and 113. The third land 113b may be useful to connect the mega-bump 143 illustrated in FIG. 3E. The top surface 112f of the core 112 may be exposed in forming the blocks 115b and 117b.

Figure 5C:
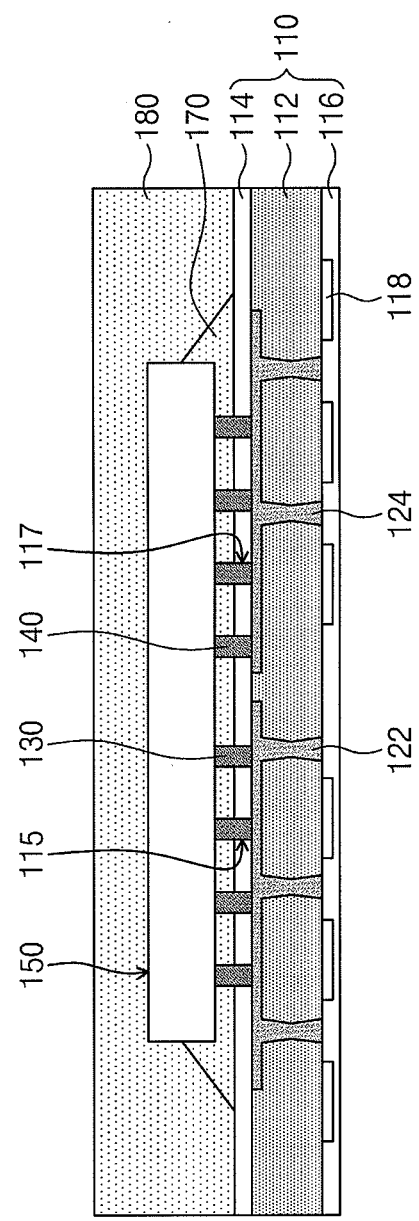

Referring to FIG. 5C, the semiconductor chip 150 may be facedown-mounted on the package substrate 110. Accordingly, the first bump group 130 may be inserted into the first opening 115 to be connected to the signal pattern 122, and the second bump group 140 may be inserted into the second opening 117 to be connected to the power pattern 124. Thereafter, a molding layer 180 may be formed on the package substrate 110 to mold the semiconductor chip 150. The molding layer 180 may comprise, for example, epoxy molding compound (EMC). Before forming the molding layer 180, an underfill layer 170 may be formed between the semiconductor substrate 150 and the package substrate 110. The underfill layer 170 may comprise dielectric resin (e.g., epoxy resin) by using, for example, a capillary flow. Referring to FIG. 5C, 6A or 6B, the top surface 112f of the core exposed in forming the openings 115 and 117 may be covered with the underfill layer 170 and/or the molding layer 180.

Referring to FIG. 5D, the lower dielectric layer 116 may be patterned to form a third opening 119 opening the substrate pad 118, and an external terminal 105 such as a solder ball may be bonded through the third opening 119. Forming the third opening 119 may be performed simultaneously with forming the first and second openings 115 and 117 according to an embodiment. The bonding of the external terminal 105 may be performed in the step of providing the package substrate 110 of FIG. 5A. Various semiconductor packages 102 to 104 can be implemented according to structures of the semiconductor chip 150 (e.g., the center pad structure and the edge pad structure), or the types of the bumps 130 and 140 (e.g., the real bump and the dummy bump).

Figure 7A:
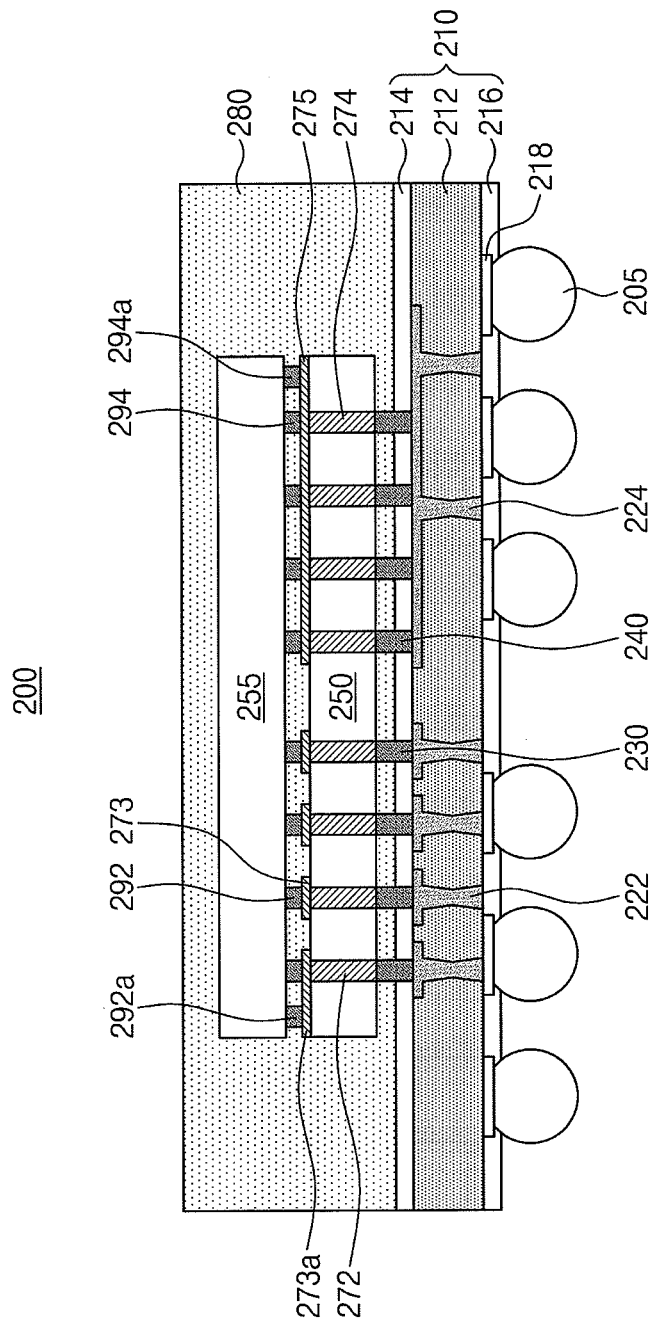
FIG. 7A is a sectional view of a semiconductor package according to an embodiment of the inventive concept.
Figure 7B:
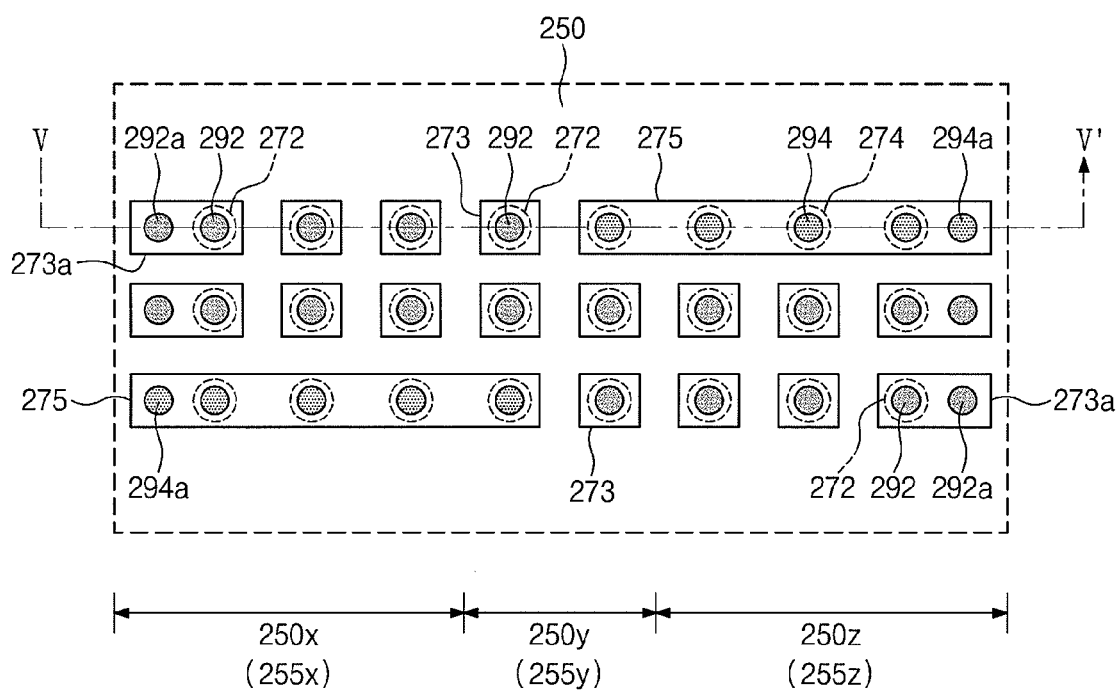
FIG. 7B is a plan view illustrating a portion of a semiconductor package according to an embodiment of the inventive concept.

FIG. 7A is a sectional view of a semiconductor package according to an embodiment of the inventive concept, which is taken along the line V-V' of FIG. 7B. FIG. 7B is a plan view illustrating a portion of a semiconductor package according to an embodiment of the inventive concept.

Referring to FIG. 7A, a semiconductor package 200 may be a multi-chip package in which a first semiconductor chip 250 and a second semiconductor chip 255 are stacked on a package substrate 210 and the resulting structure is molded by a molding layer 280. The first semiconductor chip 250 may be faceup-mounted or facedown-mounted on the package substrate 210. The second semiconductor chip 255 may be faceup-mounted or facedown-mounted on the first semiconductor chip 250.

The package substrate 210 may be a PCB in which an upper dielectric layer 214 and a lower dielectric layer 216 are formed respectively on the top and bottom surfaces of a core 212 including a signal pattern 222 and a power pattern 224. A substrate pad 218 for connecting an external terminal 205 may be formed on the bottom surface of the core 212. The first semiconductor chip 250 may be electrically connected to the package substrate 210 by through electrodes (or through vias) 272 and 274. The through electrodes 272 and 274 may be formed by forming through holes in the first semiconductor chip 250 by, for example, a laser drilling process, and filling the through holes with silicon or metal.

The through electrodes 272 and 274 may include a plurality of first through electrodes 272 connected to the signal patterns 222 to transmit data signals between the first semiconductor chip 250 and the signal patterns 222, and a plurality of second through electrodes 274 connected to the power pattern 224 to deliver power from the power pattern 224 to the first semiconductor chip 250. The signal pattern 222 may be in one-to-one correspondence with the first through electrode 272. Therefore, one first through electrode 272 may be connected to one signal pattern 222. The power pattern 224 may be in one-to-one or one-to-many correspondence with the second through electrode 274. Thus, one or more second through electrodes 274 may be connected to one power pattern 222.

Bumps 230 and 240 may be formed between the first semiconductor chip 250 and the package substrate 210. The bumps 230 may include a plurality of bumps 230 electrically connecting the signal patterns 222 to the first through electrodes 272, and a plurality of bumps 240 electrically connecting the power pattern 224 to the second through electrodes 274. The bumps 230 and 240 may be formed by, for example, plating or depositing metal (e.g., copper).

The electrical connection between the first semiconductor chip 250 and the second semiconductor chip 255 may be implemented by redistribution pads 273 and 275 and interconnection bumps 292 and 294. For example, first redistribution pads 273 connected to the first through electrodes 272 and second redistribution pads 275 connected to the second through electrodes 274 may be formed on the top surface of the first semiconductor chip 250. First interconnection bumps 292 connected to the first redistribution pads 273 and second interconnection bumps 294 connected to the second redistribution pads 275 may be formed on the bottom surface of the second semiconductor chip 255. The configuration of the first redistribution pads 273 may depend on the configuration of the first interconnection bumps 292. For example, the first redistribution pads 273 may be formed according to the arrangement of the first interconnection bumps 292. The configuration of the second redistribution pads 275 may depend on the configuration of the second interconnection bumps 294.

Referring to FIGS. 7B and 7A, one signal pattern 222 may be connected to one first through electrode 272, the one first through electrode 272 may be connected to one first redistribution pad 273, and the one first redistribution pad 273 may be connected to one first interconnection bump 292. The one first interconnection bump 292 may be a real bump. Accordingly, data signals may be exchanged between the signal pattern 222 and the semiconductor chips 250 and 255.

A first redistribution pad 273a for connecting a plurality of first interconnection bumps 292 and 292a may be included. One first redistribution pad 273a may be used as a land for the first interconnection bumps 292 and 292a. For example, the first redistribution pad 273a may be formed on at least one of the left and right edges 250x and 250z of the first semiconductor chip 250. One of the first interconnection bumps 292 and 292a may be a real bump, and the other may be a dummy bump or real bump. For example, among at least two first interconnection bumps 292 and 292a connected to the first redistribution pad 273a on the line V-V', the first interconnection bump 292 more adjacent to the center 255y of the second semiconductor chip 255 may be a real bump, and the first interconnection bump 292a more adjacent to the left edge 255x of the second semiconductor chip 255 may be a dummy bump or real bump. When the first interconnection bump 292a is a dummy bump, it may be used as a supporting bump for supporting the left edge 255x of the second semiconductor chip 255. When the first interconnection bump 292a is a real bump, it may be electrically connected to another first connection bump 292.

As an example, at least two first interconnection bumps 292 and 292a may be connected to the first redistribution pad 273a, and at least two first interconnection bumps 292 may be connected to another first redistribution pad 273. One of at least two interconnection bumps 292 may be a real bump, and the other may be a dummy bump or real bump.

One power pattern 224 may be connected to a plurality of second through electrodes 274. The plurality of second through electrodes 274 may be connected to one second redistribution pad 275. The one second redistribution pad 275 may be connected to a plurality of second interconnection bumps 294. The one second redistribution pad 275 is used as a land for the plurality of second interconnection bumps 294. At least one of the second interconnection bumps 294 may be a real bump, and the others may be dummy bumps or real bumps. As an example, a second interconnection bump 294a most adjacent to the left or right edge 250x or 250z of the first semiconductor chip 250 may be formed on the second redistribution pad 275. For example, a second interconnection bump 294a most adjacent to the right edge 250z of the second semiconductor chip 255 may be formed on the second redistribution pad 275 disposed on the line V-V'. When the second interconnection bump 294a is a dummy bump, it may be used as a supporting bump for supporting the right edge 255z of the second semiconductor chip 255. When the second interconnection bump 294a is a real bump, it may be electrically connected to other real bumps 294.

Figure 8B:
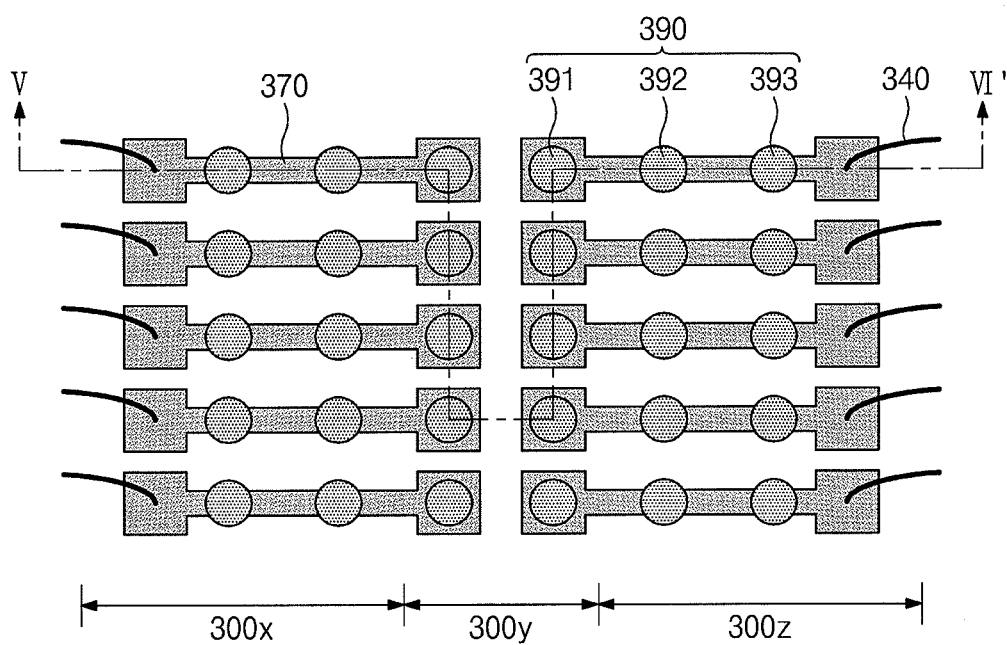
FIG. 8B is a plan view illustrating a portion of a semiconductor package according to an embodiment of the inventive concept.

FIG. 8A is a sectional view of a semiconductor package according to an embodiment of the inventive concept, which is taken along the line VI-VI' of FIG. 8B. FIG. 8B is a plan view illustrating a portion of a semiconductor package according to an embodiment of the inventive concept.

Referring to FIG. 8A, a semiconductor package 300 may be a package-on-package (POP) in which an upper package 304 is stacked on a lower package 302. The lower package 302 may be a multi-chip package in which a plurality of lower semiconductor chips 350 are mounted on top of each other on a lower package substrate 310. Similarly, the upper package 304 may be a multi-chip package in which a plurality of upper semiconductor chips 355 are mounted on top of each other on an upper package substrate 315. The lower package 302 and the upper package 304 may be electrically connected to each other through at least one redistribution pad 370 and at least one mold via group 390.

The lower package 302 may include a lower package substrate 310 such as, for example, a PCB provided with a lower circuit pattern 312 and a plurality of lower substrate pads 313 electrically connected to the lower circuit pattern 312, lower semiconductor chips 320 mounted on the lower package substrate 310, and a lower molding layer 380 molding the lower semiconductor chips 320. The lower circuit pattern may include a signal pattern, a power pattern and a ground pattern. The lower semiconductor chip 320 may include a memory, a non-memory, or a combination thereof. The lower circuit patterns 312 may be electrically connected to the lower substrate pads 313. The lower semiconductor chips 320 and the lower package substrate 310 may be adhered to each other by a dielectric adhesive 320, and may be electrically connected to each other by a plurality of lower bonding wirers 340. The lower bonding wires 340 electrically connect the circuit pattern 312 to the lower semiconductor chips 320. The lower bonding wires 340 may transmit data, power and ground signals between the lower semiconductor chips 320 and the lower package substrate 310. As an example, the lower semiconductor chips 320 and the lower package substrate 310 may be electrically connected to each other by through electrodes (e.g., 272 and 274 of FIG. 7A) penetrating the lower semiconductor chips 350. The lower package 302 may include a plurality of external terminals 330 (e.g., solder balls and solder bumps) that are connected to the lower substrate pads 313 to connect the semiconductor package 300 to an external electrical device.

The upper package 304 may be configured in the same manner as the lower package 302 in an embodiment. For example, the upper package 304 may include a upper package substrate 315 such as a PCB including an upper circuit pattern 317 and upper substrate pads 318 connected electrically to the upper circuit pattern 317, upper semiconductor chips 355 mounted on the upper package substrate 315, a dielectric adhesive 325 for adhering the upper semiconductor chips 355 to the upper package substrate 315, and an upper molding layer 304 for molding the upper semiconductor chips 355. For example, the upper semiconductor chips 355 and the upper package substrate 315 are electrically connected to each other by an upper bonding wire 345 to exchange electrical signals between the upper semiconductor chips 355 and the upper package substrate 315. As an example, the bonding wires 345 may be replaced by through electrodes formed to penetrate the upper semiconductor chips 355.

Referring to FIGS. 8B and 8A, the redistribution pad 370 may be formed on the uppermost lower semiconductor chip 350t among the lower semiconductor chips 350. The mold via group 390 may be connected to the redistribution pad 370. The mold via group 390 may include a plurality of mold vias 391, 392 and 393. The mold vias 391 to 393 may be connected to the upper substrate pads 318. The mold vias 391 to 393 may be formed by, for example, patterning the lower molding layer 380 to form mold via holes 385 opening the redistribution pad 370 and filling the mold via holes 385 with conductive materials such as metals or solders. For example, the mold vias 391 to 393 may be formed by bonding solder balls to the upper substrate pads 318, coupling the lower package 302 and the upper package 304 to insert the solder balls into the mold via holes 385, and performing a reflow process. The redistribution pad 370 may be electrically connected to the lower circuit pattern 312 of the lower package substrate 310 by the lower bonding wire 340. Thus, the lower package 302 and the upper package 304 may be electrically connected to each other by the mold via group 390 and the redistribution pad 370.

According to an embodiment, a plurality of mold vias 391 to 393 may be connected in common to one redistribution pad 370. At least one of the mold vias 391 to 393 connected to the redistribution pad 370 (e.g., the mold via 391 formed at the center 300y of the semiconductor package 300) may be a real via provided as an electrical signal path between the upper and lower packages 302 and 304, and the other vias 392 and 393 may be dummy vias. The dummy vias 392 and 393 may be used as supporting vias for supporting the edges of the upper package 304. In this case, the upper substrate pads 318 connected to the dummy vias 392 and 393 may not be formed in the upper package substrate 315. As an example, all of the mold vias 391 to 393 connected to one redistribution pad 370 may be real vias. In this case, all the mold vias 391 to 393 may be connected to the lower substrate pads 318, and these lower substrate pads 318 may be electrically connected to each other. At least one of the lower package 302 and the upper package 304 may be replaced by one of all the semiconductor packages according to the inventive concept. For example, the semiconductor packages 200 of FIG. 7A are vertically stacked and are electrically connected to each other by redistribution pads and mold vias to form a package-on-package.

Figure 9A:
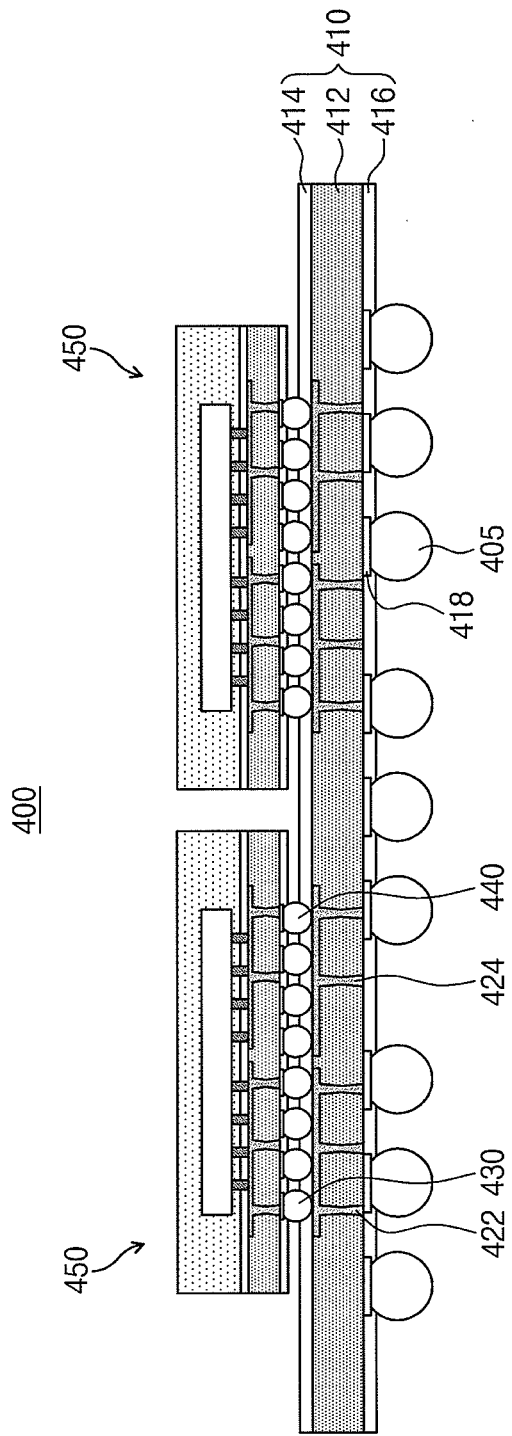
FIG. 9A is a sectional view of a semiconductor package according to an embodiment of the inventive concept.
Figure 9B:
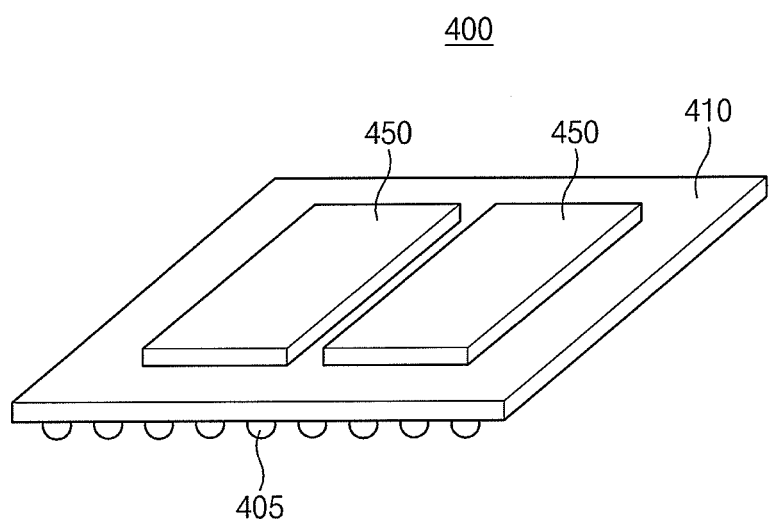
FIG. 9B is a perspective view of a semiconductor package according to an embodiment of the inventive concept.

FIG. 9A is a sectional view of a semiconductor package according to an embodiment of the inventive concept. FIG. 9B is a perspective view of a semiconductor package according to an embodiment of the inventive concept.

Referring to FIGS. 9A and 9B, a semiconductor package 400 according to an embodiment may be a semiconductor module in which at least two packages 450 are mounted on the top surface of a module substrate 410 and a plurality of external terminals 405 formed on the bottom surface of the module substrate 410. The module substrate 410 may include a core 412 including circuit patterns 422 and 424, an upper dielectric layer 412 formed on the top surface of the core 412, and a lower dielectric layer 414 formed on the bottom surface of the core 412. The semiconductor package 400 may include a plurality of substrate pads 418 electrically connected to the plurality of external terminals 405 on the bottom surface of the module substrate 410. The semiconductor package 400 may be electrically connected to an electrical device through the connection terminals 405.

The package 450 may be electrically to the module substrate 410 by interconnections terminals 430 and 440. The package 450 may be one of the various semiconductor packages according to the inventive concept. The interconnection terminals 430 and 440 may be connected to the circuit patterns 422 and 424. The circuit patterns 422 and 424 may include a signal pattern 422 and a power pattern 424. The interconnection terminals 430 and 440 may include a first interconnection terminal group 430 including a plurality of terminals connected to the signal pattern 422, and a second interconnection terminal group 440 including a plurality of terminals connected to the power pattern 424. One first interconnection terminal group 430 may be connected to one signal pattern 422, and all of the terminals included in the first interconnection terminal group 430 may be real terminals connected electrically to each other. One second interconnection terminal group 440 may be connected to one power pattern 424, and all of the terminals included in the second interconnection terminal group 440 may be real terminals connected electrically to each other.

Figure 9C:
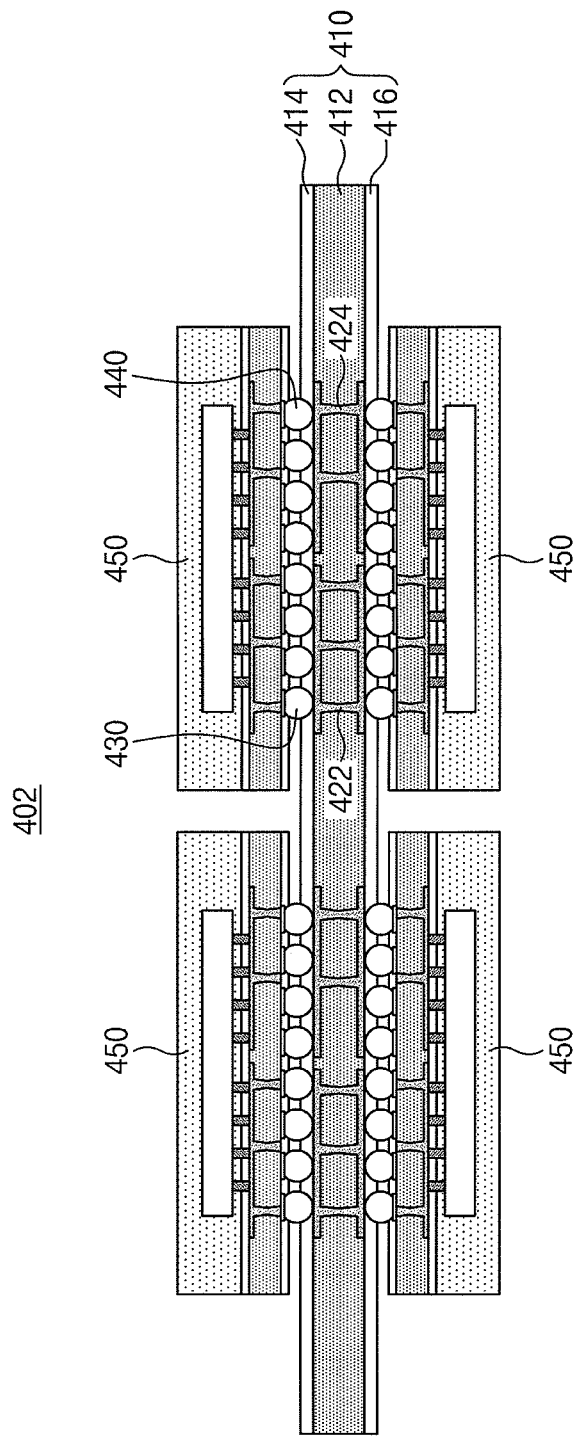
FIG. 9C is a sectional view illustrating an embodiment of the semiconductor package of FIG. 9A.
Figure 9D:
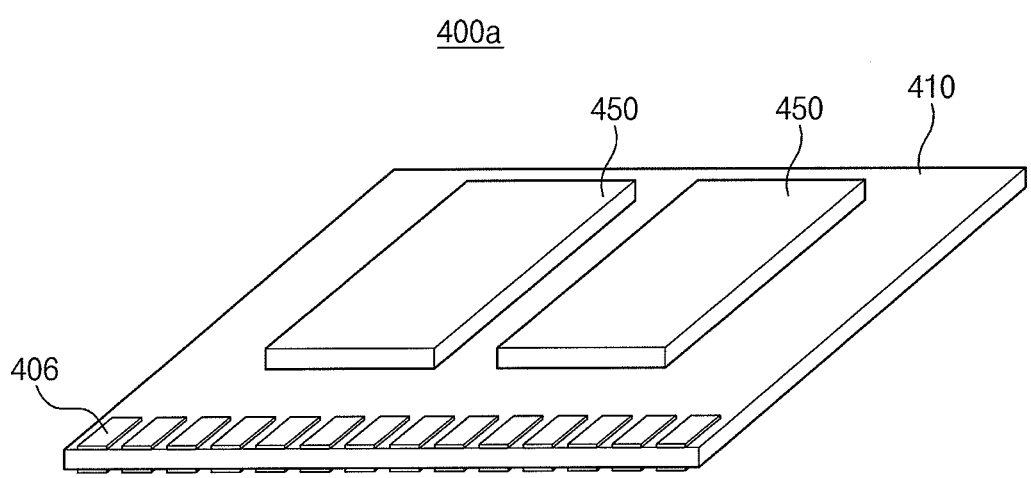
FIG. 9D is a perspective view illustrating an embodiment of the semiconductor package of FIG. 9A.

FIG. 9C is a sectional view illustrating an embodiment of the semiconductor package of FIG. 9A. FIG. 9D is a perspective view illustrating an embodiment of the semiconductor package of FIG. 9A.

Referring to FIGS. 9B and 9C, a semiconductor package 402 according to an embodiment may include packages 450 formed on the top and bottom surfaces of a module substrate 410. The semiconductor package 402 may be connected to an electrical device by external pads 406 connected electrically to the circuit patterns 422 and 424. The external pads 406 may be formed on one side of a package substrate 410.

The semiconductor packages 400 and 402 may be used in various devices. For example, the semiconductor packages 400 and 402 may be used in various electronic devices such as, for example, mobile electronic devices, notebook computers, portable multimedia players (PMPs), MP3 players, camcorders, memory sticks, memory cards, and solid state drives (SSDs).

Figure 10A:
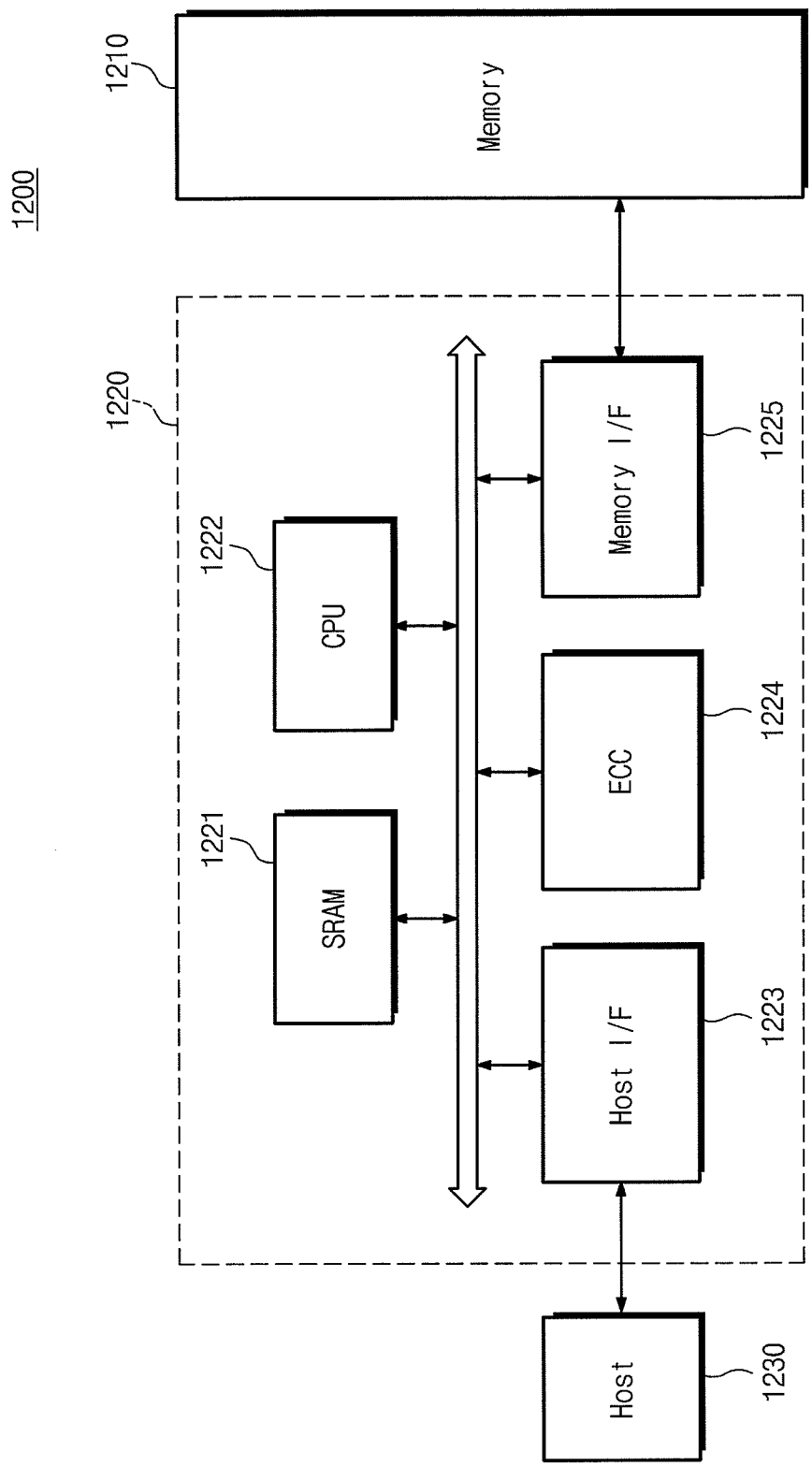
FIG. 10A is a block diagram of a memory card having a semiconductor package according to an embodiment of the inventive concept.

FIG. 10A is a block diagram of a memory card having a semiconductor package according to an embodiment of the inventive concept.

Referring to FIG. 10A, a semiconductor memory 1210 including semiconductor packages according to various embodiments of the inventive concept may be applicable to a memory card 1200. For example, the memory card 1200 includes a memory controller 1220 that controls data exchange between a host and the memory 1210. An SRAM 1221 may be used as a working memory of a central processing unit (CPU) 1222. A host interface (I/F) 1223 may have a data exchange protocol of the host connected to the memory card 1200. An error correction code (ECC) 1224 detects and corrects an error in data read from the memory 1210. A memory interface (I/F) 1225 interfaces with the memory 1210. The CPU 1222 performs an overall control operation for data exchange of the memory controller 1220.

Figure 10B:
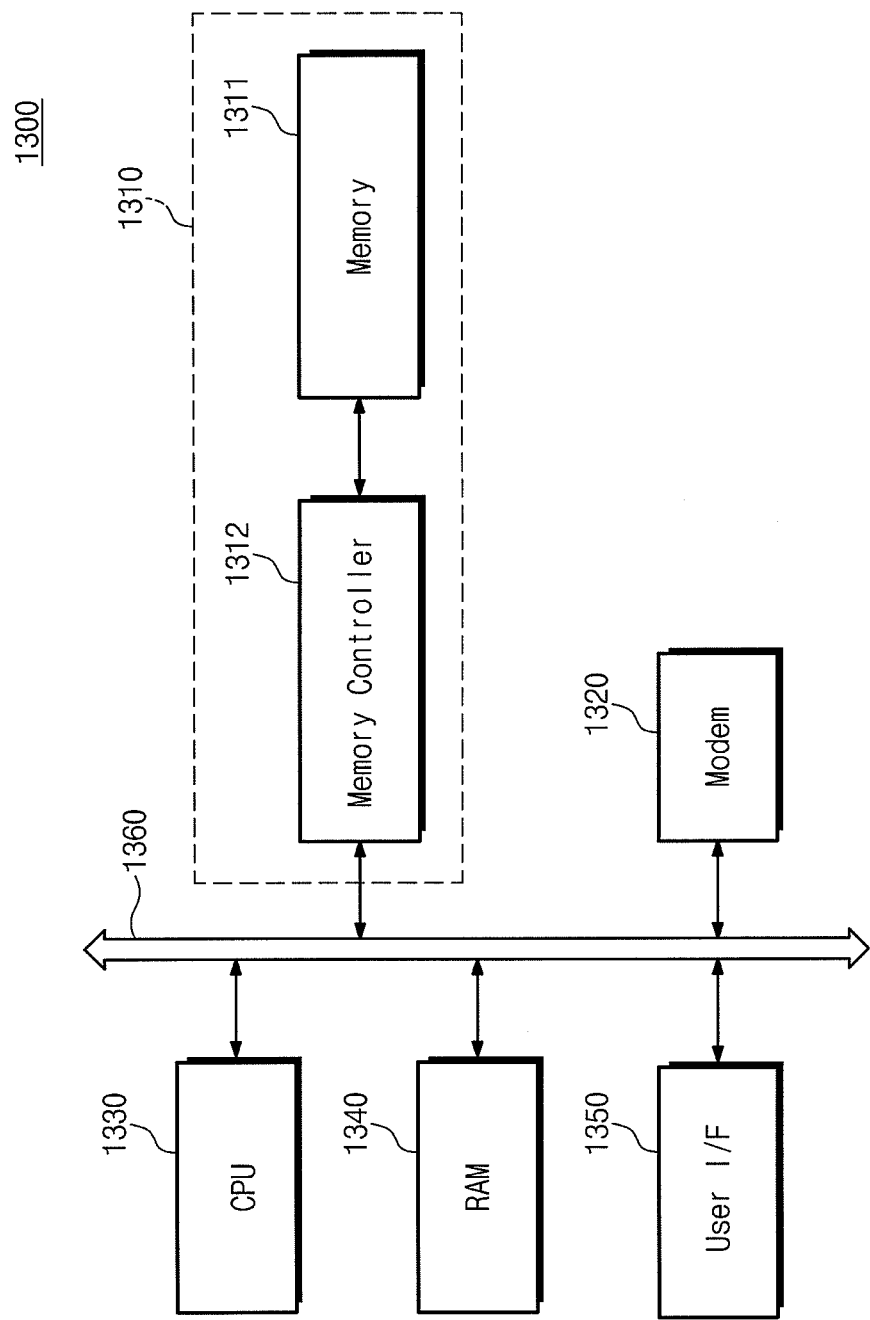
FIG. 10B is a block diagram of an information processing system using a semiconductor package according to an embodiment of the inventive concept.

FIG. 10B is a block diagram of an information processing system using a semiconductor package according to an embodiment of the inventive concept.

Referring to FIG. 10B, an information processing system 1300 may include a memory system 1310 having a semiconductor package according to an embodiment of the inventive concept. Examples of the information processing system 1300 include mobile devices and computers. For example, the information processing system 1300 includes a memory system 1310, a modem 1320, a central processing unit (CPU) 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 10A. Data processed by the CPU 1330 or data received from an external device may be stored in the memory system 1310. The information processing system 1300 may be provided for memory cards, solid state disks, camera image sensors, and other application chipsets. For example, the memory system 1310 may be configured using a solid state disk (SSD). In this case, the information processing system 1300 can store a large amount of data in the memory system 1310 stably and reliably.

Also, the semiconductor packages according to embodiments of the inventive concept may be mounted in various types of packages. Examples of the packages for the semiconductor packages according to embodiments of the inventive concept include Package on Package, Ball Grid Array, Chip Scale Package, Plastic Leaded Chip Carrier, Plastic Dual In-line Package, Multi Chip Package, Wafer Level Package, Wafer Level Stack Package, Die On Waffle Package, Die in Wafer Form, Chip On Board, Ceramic Dual In-line Package, Plastic Metric Quad Flat Pack, Thin Quad Flat Pack, Small Outline Package, Shrink Small Outline Package, Thin Small Outline Package, Thin Quad Flat Package, and System In Package.

According to embodiments of the inventive concept, bumps supporting or connecting to semiconductor chips are bonded to PCB patterns such as signal, power and ground patterns of a PCB, thereby improving the electrical and mechanical characteristics. Also, because the PCB patterns can be used as a land, it is unnecessary to form a separate land. Also, because it is unnecessary to form the PCB patterns in a bypass manner, the PCB can be effectively used. The inventive concept can be widely used for chip stacking, package stacking, semiconductor modules, or mounting semiconductor chips on a PCB.

Although the exemplary embodiments of the inventive concept have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor package comprising:
a semiconductor chip having a first bump group including a plurality of first bumps and a second bump group including a plurality of second bumps; and
a package substrate having a first pattern for data communication with the semiconductor chip and a second pattern for supplying power to the semiconductor chip or grounding the semiconductor chip, wherein the plurality of first bumps are commonly disposed on the first pattern and are commonly connected to the first pattern, and the plurality of second bumps are commonly disposed on the second pattern and are commonly connected to the second pattern, wherein the first pattern comprises a first land and a first extension portion extending from the first land, and the second pattern comprises a second land and a second extension portion extending from the second land, the first extension portion having a width smaller than a width of the first land, and the second extension portion having, a width greater than a width of the second land and wherein the plurality of first bumps comprise a first real bump disposed on the first land and a plurality of first dummy bumps disposed on the first extension portion, and the plurality of second bumps comprise a second real bump disposed on the second land and a plurality of second dummy bumps disposed on the second extension portion.

2. The semiconductor package of claim 1, wherein
the first bump group comprises the first real bump disposed on a first conductive pad of the semiconductor chip and the plurality of first dummy bumps disposed on a passivation layer of the semiconductor chip, and
the second bump group comprises the second real bump disposed on a second conductive pad and the plurality of second dummy bump disposed on the passivation layer.

3. The semiconductor package of claim 2, wherein the first real bump and the second real bump are disposed between the plurality of first dummy bumps and the plurality of second dummy bumps.

4. The semiconductor package of claim 2, wherein the plurality of first dummy bumps and the plurality of second dummy bumps are disposed between the first real bump and the second real bump.

5. The semiconductor package of claim 1, wherein
the first bump group comprises the first real bump disposed on a first conductive pad of the semiconductor chip and the plurality of first dummy bumps disposed on a passivation layer of the semiconductor chip, and
the second bump group comprises the second real bump disposed on a second conductive pad and a third real bump disposed on a third conductive pad.

6. The semiconductor package of claim 5, wherein the second conductive pad and the third conductive pad are electrically connected to each other.

7. The semiconductor package of claim 5, wherein the second conductive pad and the third conductive pad are electrically isolated from each other.

8. The semiconductor package of claim 5, wherein the second bump group further comprises a fourth real bump disposed on both a fourth conductive pad and a fifth conductive pad.

9. The semiconductor package of claim 1, wherein
the first bump group comprises the first real bump disposed on a first conductive pad of the semiconductor chip and an additional real bump disposed on a second conductive pad, and
the second bump group comprises a third real bump disposed on a third conductive pad and a fourth real bump disposed on a fourth conductive pad.

10. The semiconductor package of claim 9, wherein the second bump group further comprises a fifth real bump disposed on both a fifth conductive pad and a sixth conductive pad.

11. The semiconductor package of claim 9, wherein the third real bump and the fourth real bump are disposed on a common power metal formed on a substrate of the semiconductor chip.

12. The semiconductor package of claim 9, wherein the third real bump and the fourth real bump are disposed on a redistribution line disposed on a substrate of the semiconductor chip.

13. The semiconductor package of claim 9, wherein the first real bump and the additional real bump are electrically connected to each other, and the third real bump and the fourth real bump are electrically connected to each other.

14. The semiconductor package of claim 9, wherein the first real bump and the additional real bump are electrically connected to each other, and the third real bump and the fourth real bump are electrically isolated from each other.

15. The semiconductor package of claim 7, wherein a width of the second conductive pad is larger than a width of the third conductive pad.

16. The semiconductor package of claim 2, wherein the first real bump provides an electrical signal path between the semiconductor chip and the first pattern, and the plurality of first dummy bumps supports the semiconductor chip on the package substrate.

17. The semiconductor package of claim 16, wherein second real bump provides a power signal path between the semiconductor chip and the second pattern, and the plurality of second dummy bumps supports the semiconductor chip on the package substrate.

18. The semiconductor package of claim 2, wherein at least one of the plurality of first dummy bumps is larger than the first real bump and at least one of the plurality of second dummy bumps is larger than the second real bump.

19. The semiconductor package of claim 1, wherein the first and second patterns comprise PCB patterns.

20. The semiconductor package of claim 19, wherein the first and second real bumps comprise metal.

21. A semiconductor package comprising:
a package substrate having at least one circuit pattern comprising a land and an extension portion extending from the land the land having a width different from a width of the extension portion; and
a semiconductor chip having a plurality of bumps, the semiconductor chip disposed on the package substrate, wherein the plurality of bumps of the semiconductor chip are commonly disposed on and commonly connected to one of the at least one circuit pattern, and wherein the plurality of bumps comprise a first bump disposed on the land and a plurality of second bumps disposed on the extension portion.

22. The semiconductor package of claim 21, wherein the first bump is disposed on a pad and is connected to an on chip circuit, and the plurality of second bumps are disposed on a passivation layer of the semiconductor chip.

23. The semiconductor package of claim 21, wherein the first bump is disposed on a pad and is connected to an on chip circuit, and the plurality of second bumps are disposed on an on chip metal and electrically connected to the first bump.

24. The semiconductor package of claim 22, wherein at least one of the plurality of second bumps is larger than the first bump.

25. A semiconductor package comprising:
a package substrate having a plurality of circuit patterns each having a land and an extension portion extending from the land, the land having a width different from a width of the extension portion; and
a semiconductor chip having a plurality of bumps including a first bump disposed on the land and a plurality of second bumps disposed on the extension portion, the semiconductor chip disposed on the package substrate, wherein respective extension paths of the plurality of bumps correspond to respective extension paths of the circuit patterns, and wherein the plurality of bumps are commonly connected to one of the circuit patterns.

26. The semiconductor package of claim 25, wherein the plurality of bumps are distributed uniformly.

27. The semiconductor package of claim 25, wherein the plurality of bumps are distributed non-uniformly.

28. The semiconductor package of claim 27, wherein a majority of the plurality of bumps are distributed near an edge of the semiconductor chip.

29. A method of forming a semiconductor package, the method comprising:
forming a plurality of circuit patterns on a package substrate, each of the plurality of circuit patterns including a land and an extension portion extending from the land, the land having a width different from a width of the extension portion;
forming a plurality of bumps on a semiconductor chip along extension paths of the plurality of circuit patterns of the package substrate, the plurality of bumps comprising a first bump electrically connecting the semiconductor chip to the package substrate and a plurality of second bumps supporting the semiconductor chip on the package substrate; and
disposing the package substrate on the semiconductor chip such that the first bump is disposed on the land, and the plurality of second bumps are disposed on the extension portion.

30. The method of claim 29, wherein the plurality of bumps are disposed uniformly from one end to the other end of each circuit pattern.

31. The method of claim 30, wherein the plurality of second bumps are electrically insulated from the circuit patterns.

32. A system for transmitting or receiving data, the system comprising:
a memory device for storing a program; and
a processor in communication with the memory device, wherein the memory device comprises a semiconductor package comprising: a package substrate having a plurality of circuit patterns each having a land and an extension portion extending from the land, the land having a width different from a width of the extension portion; and a semiconductor chip having a plurality of bumps including a first bump disposed on the land and a plurality of second bumps disposed on the extension portion, the semiconductor chip disposed on the package substrate, wherein respective extension paths of the plurality of bumps correspond to respective extension paths of the circuit patterns.

33. The system of claim 32, wherein the system comprises at least one of a mobile system, a portable computer, a web tablet, a mobile phone, a digital music player, or a memory card.

* * * * *